United States Patent
Yun et al.

(10) Patent No.: US 12,402,332 B2
(45) Date of Patent: Aug. 26, 2025

(54) INTEGRATED PASSIVE DEVICES

(71) Applicant: RF360 Singapore Pte. Ltd, Singapore (SG)

(72) Inventors: Changhan Hobie Yun, San Diego, CA (US); Nosun Park, Incheon (KR); Paragkumar Ajaybhai Thadesar, San Diego, CA (US); Daniel Daeik Kim, San Diego, CA (US); Sameer Sunil Vadhavkar, San Diego, CA (US); Vinay Prakash, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 760 days.

(21) Appl. No.: 17/473,847

(22) Filed: Sep. 13, 2021

(65) Prior Publication Data

US 2023/0082743 A1   Mar. 16, 2023

(51) Int. Cl.
 *H10D 1/20*  (2025.01)
 *H01L 21/48* (2006.01)
 (Continued)

(52) U.S. Cl.
 CPC ........... *H10D 1/20* (2025.01); *H01L 21/4853* (2013.01); *H01L 21/4857* (2013.01);
 (Continued)

(58) Field of Classification Search
 CPC . H01L 28/10; H01L 21/4853; H01L 21/4857; H01L 21/565; H01L 23/3128; H01L 23/5383; H01L 23/5386; H01L 23/5389; H01L 24/16; H01L 28/40; H01L 2224/16227; H01L 2924/14215;
 (Continued)

(56) References Cited

U.S. PATENT DOCUMENTS 11,011,461 B2   5/2021  Zhang et al.
2015/0201495 A1*  7/2015  Kim ..................... H05K 1/0306
                                                             174/255
(Continued)

FOREIGN PATENT DOCUMENTS

DE   202014104574 U1   11/2014
GB      2461443 A       1/2010

OTHER PUBLICATIONS

International Search Report and Written Opinion—PCT/EP2022/071472—ISA/EPO—Dec. 19, 2022.

*Primary Examiner* — Fernando L Toledo
*Assistant Examiner* — Neil R Prasad
(74) *Attorney, Agent, or Firm* — Muncy, Geissler, Olds & Lowe, P.C./QUALCOMM

(57) ABSTRACT

Disclosed are a device and techniques for fabricating the device. The device may include a top substrate including a plurality of top vias coupled to a first top metal layer that forms a top winding portion of a first inductor. The device also includes a middle substrate including one or more middle metal layers. The top substrate is disposed on the middle substrate. The one or more middle metal layers form a middle winding portion of the first inductor. The device also includes a bottom substrate electrically coupled to the middle substrate opposite the top substrate, where a first bottom metal layer of the bottom substrate forms a bottom winding portion of the first inductor.

39 Claims, 15 Drawing Sheets

(51) Int. Cl.
  *H01L 21/56*   (2006.01)
  *H01L 23/00*   (2006.01)
  *H01L 23/31*   (2006.01)
  *H01L 23/538*  (2006.01)
  *H10D 1/68*    (2025.01)

(52) U.S. Cl.
  CPC ........ *H01L 21/565* (2013.01); *H01L 23/3128* (2013.01); *H01L 23/5383* (2013.01); *H01L 23/5386* (2013.01); *H01L 23/5389* (2013.01); *H01L 24/16* (2013.01); *H10D 1/68* (2025.01); *H01L 2224/16227* (2013.01); *H01L 2924/14215* (2013.01); *H01L 2924/19041* (2013.01); *H01L 2924/19042* (2013.01); *H01L 2924/19103* (2013.01)

(58) Field of Classification Search
  CPC . H01L 2924/19041; H01L 2924/19042; H01L 2924/19103
  See application file for complete search history.

(56) References Cited

U.S. PATENT DOCUMENTS

| | | | |
|---|---|---|---|
| 2015/0279920 A1* | 10/2015 | Zuo | H01L 21/486 |
| | | | 438/381 |
| 2019/0132942 A1 | 5/2019 | Yun et al. | |
| 2020/0091094 A1* | 3/2020 | Yun | H01L 23/5227 |
| 2020/0144358 A1* | 5/2020 | Koduri | H01L 28/10 |
| 2021/0099149 A1* | 4/2021 | Lan | H03H 7/1741 |
| 2021/0398957 A1* | 12/2021 | Lan | H01L 25/162 |

* cited by examiner

INTEGRATED PASSIVE DEVICES

BACKGROUND OF THE DISCLOSURE

1. Field of the Disclosure

Aspects of the disclosure relate generally to devices, such as integrated circuits, semiconductor devices, and particularly to integrated passive devices including passive devices on or embedded in insulator materials.

2. Description of the Related Art

Integrated circuit (IC) technology has achieved great strides in advancing computing power through miniaturization of active components. Integrated passive components have also been miniaturized. As frequencies and data rates get higher, there is a need for further miniaturization and increased functional combination of integrated passive components, for example, filters which include inductive (L) and capacitive (C) elements in IC devices. Additionally, to improve quality of received signals, certain components of a mobile device may be formed on an insulating substrate (e.g., glass substrate). For example, a circuit component may be formed on a glass substrate to "isolate" the component in order to reduce effects of noise from other components of the mobile device.

In some applications, integrated passive devices (IPD) including inductor and capacitor components suffer low inductor density and reduced Q factor (i.e., a dimensionless parameter that relates the inductor to an ideal inductor). Accordingly, there is a need for systems, apparatuses and methods that overcome the deficiencies of conventional IC device designs having integrated passive devices including the methods, systems and apparatuses provided herein in the following disclosure.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes, an apparatus comprising a device. The device may include a top substrate including a plurality of top vias coupled to a first top metal layer that forms a top winding portion of a first inductor. The device also includes a middle substrate including one or more middle metal layers. The top substrate is disposed on the middle substrate. The one or more middle metal layers form a middle winding portion of the first inductor. The device also includes a bottom substrate electrically coupled to the middle substrate opposite the top substrate, where a first bottom metal layer of the bottom substrate forms a bottom winding portion of the first inductor.

In accordance with the various aspects disclosed herein, at least one aspect includes a method for fabricating a device. The method also includes forming a top substrate including a plurality of top vias coupled to a first top metal layer that forms a top winding portion of a first inductor. The method also includes forming a middle substrate including one or more middle metal layers, where the top substrate is disposed on the middle substrate and where the one or more middle metal layers form a middle winding portion of the first inductor. The method also includes forming a bottom substrate electrically coupled to the middle substrate opposite the top substrate, where a first bottom metal layer of the bottom substrate forms a bottom winding portion.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
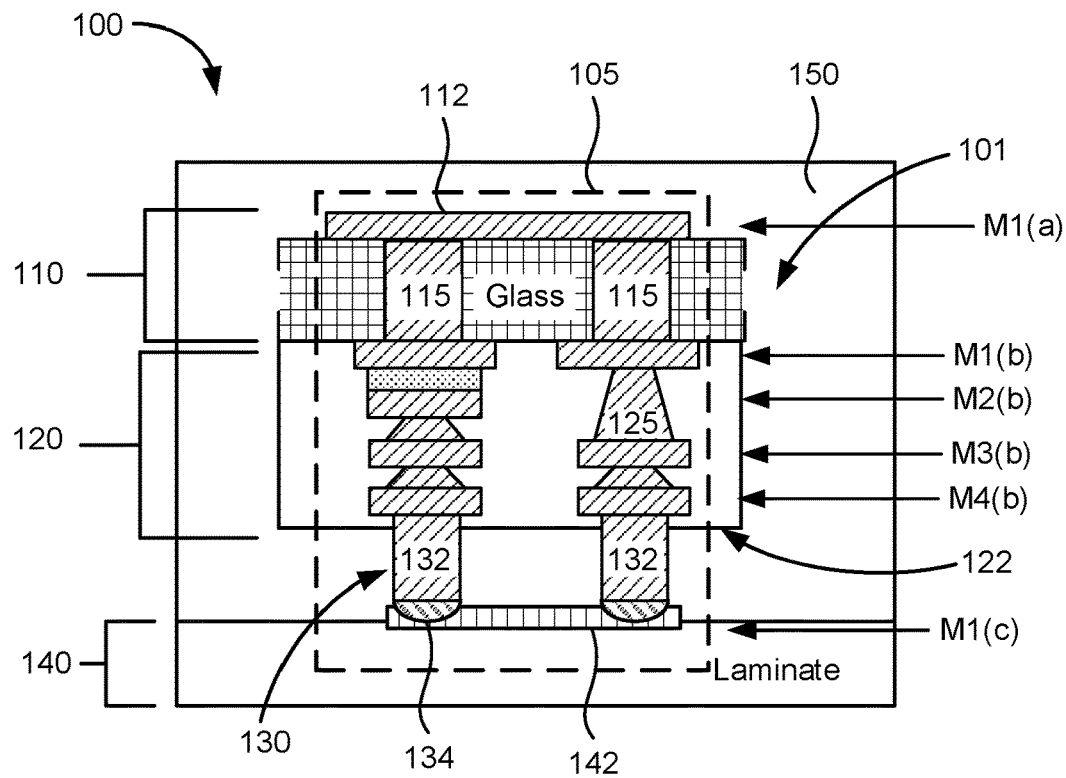
FIG. 1A illustrates a portion of an apparatus including a device in accordance with at least one aspect of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1A illustrates a portion of an apparatus 100 including a device 101 (e.g., semiconductor device, integrated circuit, IPD, etc.) in accordance with at least one aspect of the disclosure. The device 101 may comprise a top substrate 110, a middle substrate 120 and a bottom substrate 140. The bottom substrate 140 may be a laminate, a semiconductor die, or any substrate that having at least one metal layer that can be used to form a bottom winding portion, as discussed herein. The top substrate may include a plurality of top vias 115 coupled to a first top metal layer M1a that forms a top winding portion 112 of a first inductor 105. It will be appreciated that the first inductor 105 is illustrated in a cross-sectional view, so the interconnections of the windings are not illustrated, but will readily be understood by one skilled in the art. The top substrate 110 is disposed on the middle substrate 120. The middle substrate 120 can include a plurality of middle vias 125 and one or more middle metal layers (e.g., M1(b), M2(b), M3(b) and M4(b)). The plurality of middle vias 125 and the one or more middle metal layers (M1(b)-M4(b)) form a middle winding portion 122 of the first inductor 105. It will be appreciated that other components may be coupled to one or more of the plurality of middle vias 125 and one or more middle metal layers (M1(b)-M4(b)). Further, it will be appreciated that in some aspects the plurality of middle vias 125 and the one or more middle metal layers may have more or less metal layers and vias than illustrated. For example, the one or more middle metal layers may only include a top metal layer and a bottom metal layer (e.g., top metal layer M1(b) and bottom metal layer M2(b)) with a plurality of vias 125 connecting the top metal layer and the bottom metal layer. In further aspects, the middle substrate 120 may only include one metal layer used to the form middle winding portion 122. In still further aspects, the middle layer may include a dielectric between the two metal layers to form a metal-insulator-metal (MIM) capacitor (discussed further below). Accordingly, the various aspects are not limited to having middle vias 125 in all disclosed aspects. As further illustrated, the bottom substrate 140 is electrically coupled to the middle substrate 120 opposite the top substrate 110. A first bottom metal layer M1(c) of the bottom substrate 140 forms a bottom winding portion 142 of the first inductor 105.

A plurality of connectors 130 can be used to electrically couple the middle substrate 120 to the bottom substrate 140. In some aspects, each of the plurality of connectors 130 can comprise a conductive pillar 132 (e.g., copper (Cu) or other highly conductive material) and solder portion 134. The conductive pillar is coupled to the middle substrate 120 and the solder portion is coupled to the bottom substrate 140. A mold portion 150 may be deposited over the device 101 to encapsulate at least the top substrate 110 and the middle substrate 120.

In some aspects, the first top metal layer M1(a) is a top metal layer of the top substrate 110. However, in other aspects it could be a different metal layer in the top substrate 110 In some aspects, the first bottom metal layer M1(c) is a top metal layer of the bottom substrate 140. However, in other aspects it could be a different metal layer in the bottom substrate 140. Accordingly, it will be appreciated that the various aspects disclosed herein are not limited to the illustrated configuration, which is provided merely as an example to aid in the explanation of the various aspects.

Figure 1B:
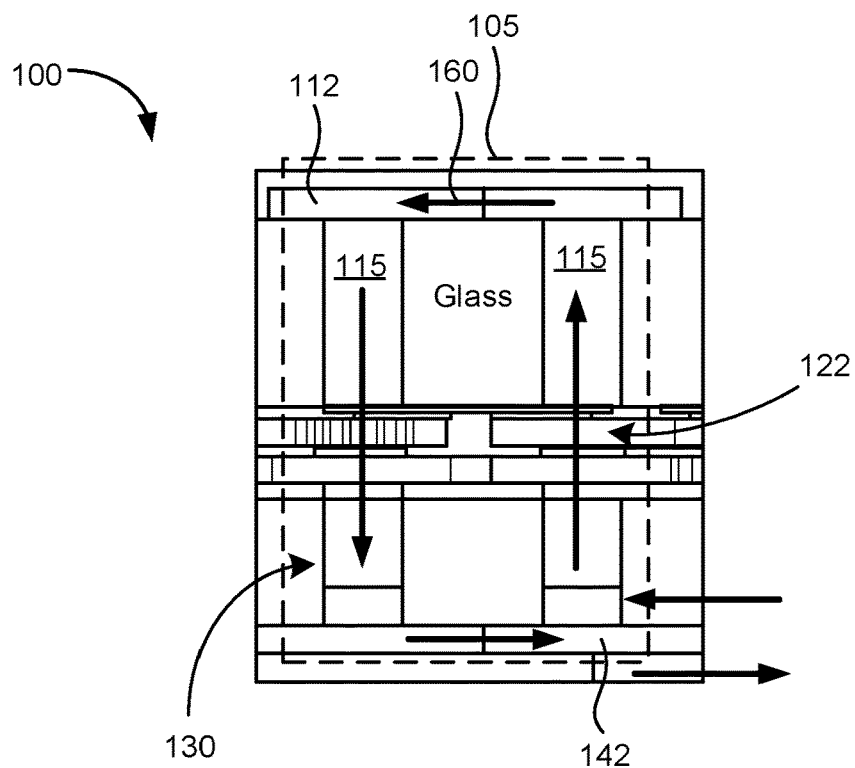
FIG. 1B illustrates a current flow in a portion of an apparatus in accordance with at least one aspect of the disclosure.

FIG. 1B illustrates a current flow in a portion of an apparatus 100 in accordance with at least one aspect of the disclosure. In this illustration, a flow of current 160 is illustrated by arrows through a portion of the windings of the first inductor 105. For example, the current 160 may enter at a first of the plurality of connectors 130 and flow through a first portion of the middle winding portion 122 to a first of the top vias 115 and the top winding portion 112 of the first inductor 105. The current 160 may leave the top winding portion 112 and flow through a second of the top vias 115, a second portion of the middle winding portion 122, a second of the plurality of connectors 130 and flow through the bottom winding portion 142 of the first inductor 105 completing one turn of the winding. The current 160 can exit this portion of the windings and proceed to another winding or port of the first inductor.

From foregoing, it will be appreciated that by using the portions of the top substrate 110, the middle substrate 120, and the bottom substrate 140, the length of the winding can be significantly increased as compared to a winding being formed in one substrate. For example, in some aspects, the top substrate 110 may have a height on the order of 100 micrometers (um) to 300 um, the middle substrate 120 may have a height on the order of 30 um to 70 um and the connectors 130 may have a height on the order of 60 um to 140 um. Accordingly, even if the top metal layer (e.g., M1(c)) in the bottom substrate is used the combined height is on the order of 220 um, which is significantly larger than any of the individual substrates or connectors. The longer windings allow for greater inductance values to be formed in a given portion of the device. Additionally, the longer windings result in less turns and it reduces the number of corners for a given inductance and less turns/corners per unit of inductance improves the Q factor of the inductor. In some aspects, the Q factor can be increased greater than 25% over conventional designs.

Figure 2A:
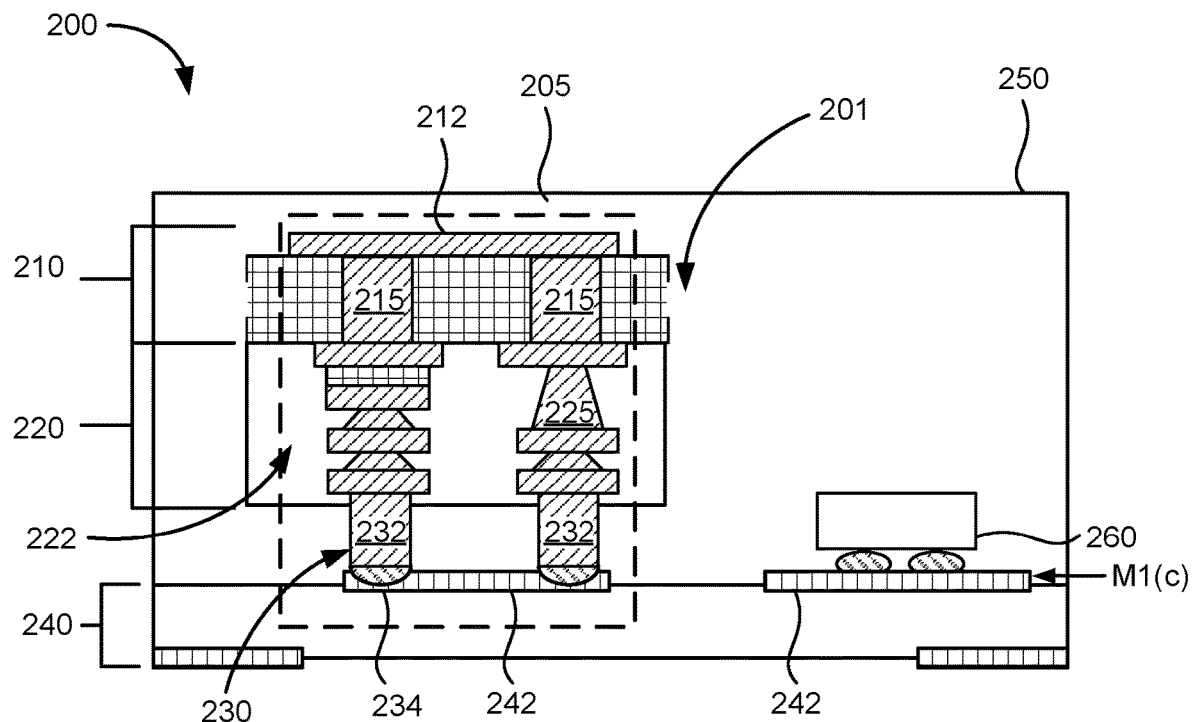
FIG. 2A illustrates a portion of an apparatus including a device and a die in accordance with at least one aspect of the disclosure.

FIG. 2A illustrates a portion of an apparatus 200 including a device 201 (e.g., semiconductor device, integrated circuit, IPD, etc.) and a die 260 in accordance with at least one aspect of the disclosure. The device 201 has some features similar to device 101, so a detailed repetition of all similar aspects will not be provided. The device 201 may comprise a top substrate 210, a middle substrate 220 and a bottom substrate 240. The top substrate 210 may include a plurality of top vias 215 coupled to a first top metal layer that forms a top winding portion 212 of a first inductor 205. The top substrate 210 is disposed on the middle substrate 220. The middle substrate 220 can include a plurality of middle vias 225 and a plurality of middle metal layers. The plurality of middle vias 225 and the plurality of middle metal layers form a middle winding portion 222 of the first inductor 205. It will be appreciated that other components may be coupled to one or more of the plurality of middle vias 225 and plurality of middle metal layers. The bottom substrate 240 is electrically coupled to the middle substrate 220 opposite the top substrate 210. A first bottom metal layer M1(c) of the bottom substrate 240 forms a bottom winding portion 242 of the first inductor 205. Additionally, a second portion 244 of the bottom metal layer M1(c) is configured to electrically couple the die 260 to the device 201, which in some aspects may be a radio frequency (RF) filter. In some aspects, the die 260 may be a power amplifier (PA) and the device 201 may be configured as a transmit (Tx) filter. In some aspects, the die 260 may be a low noise amplifier (LNA) and the device 201 may be configured as receive (Rx) filter.

A plurality of connectors 230 can be used to electrically couple the middle substrate 220 to the bottom substrate 240. In some aspects, each of the plurality of connectors 230 can comprise a conductive pillar 232 (e.g., copper, or other highly conductive material) and solder portion 234. The conductive pillar is coupled to the middle substrate 220 and the solder portion is coupled to the bottom substrate 240. A mold portion 250 may be deposited over the device 201 to encapsulate at least the top substrate 210 and the middle substrate 220. It will be appreciated that die 260 is coupled to the device 201 through the bottom substrate and the plurality of connectors.

Figure 2B:
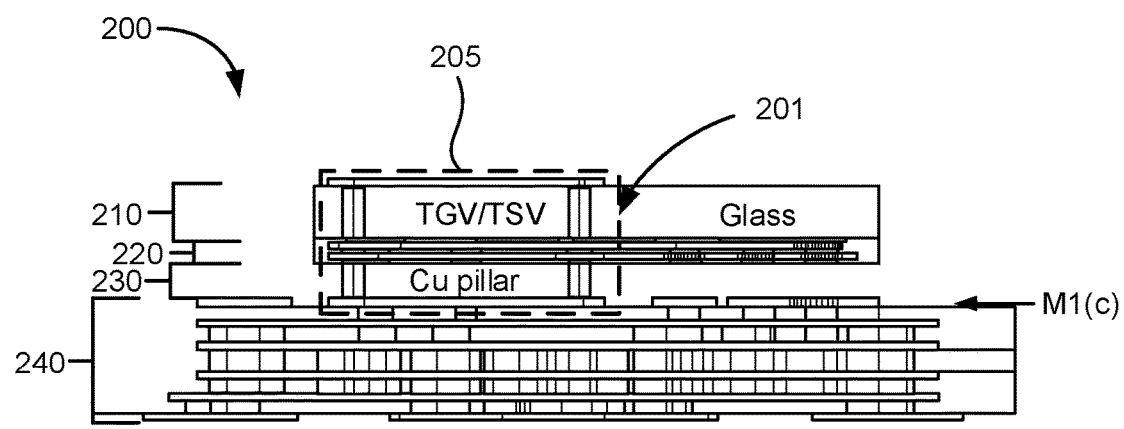
FIG. 2B illustrates a portion of an apparatus including a device in accordance with at least one aspect of the disclosure.

FIG. 2B illustrates a portion of an apparatus 200 including a device 201 in accordance with at least one aspect of the disclosure. It will be appreciated from the scaling (which is not to any specific scale) of the top substrate 210, the middle substrate 220, the connectors 230 and the bottom substrate 240 that the various substrates may have different heights. Further, it will be appreciated that the bottom substrate may have additional metal layers than the just the top metal layer M1(c), as discussed herein. Although, as illustrated, the bottom winding portion 242 of the first inductor 205 is in the top metal layer M1(c), in some aspects, the bottom winding portion could be in other lower metal layers (e.g., below M1(c)). Further, the additional metal layers can be used for signal routing between the die (not shown) and the device 201, to other components coupled to the bottom substrate (if any) and/or to external components. The number of additional metal layers in the bottom substrate and the vias interconnecting the metal layer may vary in number and configuration. Accordingly, it will be appreciated that the various aspects disclosed herein are not limited to the illustrated configuration, which is provided merely as an example to aid in the explanation of the various aspects.

Figure 3:
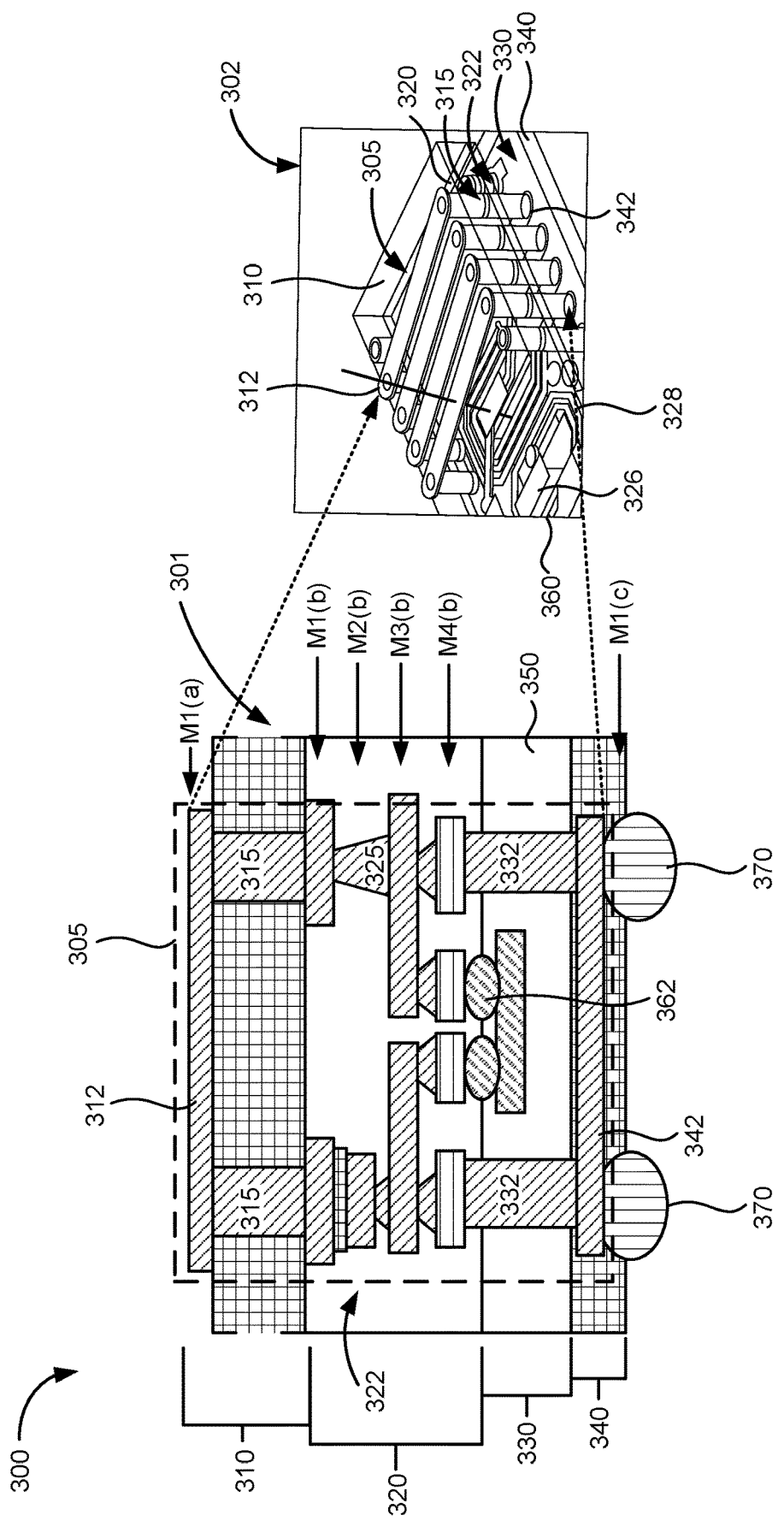
FIG. 3 illustrates a portion of an apparatus including a device and a die in accordance with at least one aspect of the disclosure.

FIG. 3 illustrates a portion of an apparatus 300 including a device 301 (e.g., semiconductor device, integrated circuit, IPD, etc.) and a die 360 in accordance with at least one aspect of the disclosure. The device 301 has some features similar to device 101, so a detailed repetition of all similar aspects will not be provided. The device 301 may comprise a top substrate 310, a middle substrate 320 and a bottom substrate 340. The top substrate 310 may include a plurality of top vias 315 coupled to a top winding portion 312 of a first inductor 305 formed in a first top metal layer, e.g., M1(a). The top substrate 310 is disposed on the middle substrate 320. The middle substrate 320 can include a plurality of middle vias 325 and a plurality of middle metal layers (e.g., M1(b), M2(b), M3(b) and M4(b)). The plurality of middle vias 325 and the plurality of middle metal layers form a middle winding portion 322 of the first inductor 305. It will be appreciated that other components may be coupled to one or more of the plurality of middle vias 325 and plurality of middle metal layers, e.g., M1(b)-M4(b). The bottom substrate 340 is electrically coupled to the middle substrate 320 on a side opposite the top substrate 310. A first bottom metal layer M1(c) of the bottom substrate 340 forms a bottom winding portion 342 of the first inductor 305. In some aspects of the disclosure, the die 360 may be physically and electrically coupled to the middle substrate 320 of the device 301. A plurality of die connectors 362 (e.g., solder balls, bumps, etc.) may be used to couple the die 360 to the middle substrate 320. In some aspects, the die 360 may be a power amplifier (PA) and the device 301 may be configured as a transmit (Tx) filter. In some aspects, the die 360 may be a low noise amplifier (LNA) and the device 301 may be configured as receive (Rx) filter.

A plurality of connectors 330 can be used to electrically couple the middle substrate 320 to the bottom substrate 340. In some aspects, each of the plurality of connectors 330 can comprise a conductive pillar 332 (e.g., copper, or other highly conductive material). The conductive pillar 332 is coupled between the middle substrate 320 and the bottom substrate 340. In some aspects, a solder portion can be used to join the conductive pillar 332 to the bottom substrate 340. (e.g., bottom winding in a package substrate). In other aspects, a metal to metal, (e.g., Cu to Cu) direct bonding may also be used possible (e.g., bottom winding is in wafer form). A mold portion 350 may be deposited over connectors 330 and die 360 to encapsulate at least a portion of the connectors 330 and the die 360.

It will be appreciated that die 360 is coupled to the device 301 through the middle substrate 320 and the plurality of die connectors 362. Since the bottom substrate is not used for routing signal and/or power from a die to the device, the complexity of routing in the bottom substrate 340 is reduced. Further, since the die is coupled to middle substrate 320, the number of connectors 370 (e.g., solder balls, pins, etc.) can be reduced and/or used for other signaling or power connections. In according to the various aspects disclosed, a reduction of the overall height and/or x-y size can be achieved. It will be appreciated that inductance is proportional to the total length of the inductor traces, so height can impact the inductance achievable in a given design (e.g., 1-10 nH in most sub-6 GHz applications). Accordingly, the various aspects disclosed can be used to maintain a certain height for a given inductor and/or to reduce the number of turns and x-y size). To further improve the space utilization, in some aspects, a semiconductor die can be placed inside the inductor envelope to provide increased functionality and not impact overall height.

FIG. 3 additionally illustrates a breakout portion 302 displayed in a perspective view that illustrates some of the components not readily visible from the cross-sectional view. As can be seen in the illustrated example, the first inductor 305 may be formed as a 3-dimensional (3D)

inductor that has multiple turns, including the top winding portion 312 in the top substrate 310 and the bottom winding portion 342 in the bottom substrate 340. The top winding portion 312 is coupled to the bottom winding portion 342 by columns, which may be formed by the top vias 315, middle winding portion 322 and connectors 330. Although represented as columns, it will be appreciated that the various aspects are not limited to this configuration and any shape may be used to electrically couple the top winding portion 312 and the bottom winding portion 342. It will be appreciated from the illustrated example aspects, that the first inductor 305 can enclose at least a portion the middle substrate 320.

The middle substrate 320 may include one or more metal-insulator-metal (MIM) capacitors 326 and one or more additional inductors 328. It will be appreciated that the MIM capacitors 326 and the inductors 328 may be part of an integrated passive device (IPD) formed in the middle substrate 320 using the plurality of middle vias 325 and the plurality of middle metal layers M1(b)-M4(b), as is known in the art. The plurality of middle metal layers may not be equally spaced to facilitate fabrication of the various components. For example, the first two metal layers M1(b) and M2(b) may be closer together to facilitate the formation and connection of the MIM capacitors 326. The spacing between metal layers M2(b), M3(b) and M4(b) may be greater than the spacing between the first two metal layers, M1(b) and M2(b) to facilitate forming the inductors 328. The using one or more of the various metal layers M1(b)-M4(b) and vias 325, the inductors 328 may be formed as 2D, 2.5D or 3D inductors in the middle substrate. It will be appreciated that the MIM capacitors 326 and inductors 328 may be coupled to one or more of the plurality of middle vias 325 and plurality of middle metal layers M1(b)-M4(b) that form part of the first inductor 305. Further, it will be appreciated that various aspects disclosed include configurations with more than one inductor formed through the top substrate 310, middle substrate 320 and bottom substrate 340, as discussed in relation to the first inductor 305. Accordingly, it will be appreciated that the various aspects disclosed herein are not limited to the illustrated configuration, which is provided merely as an example to aid in the explanation of the various aspects.

Figure 4:
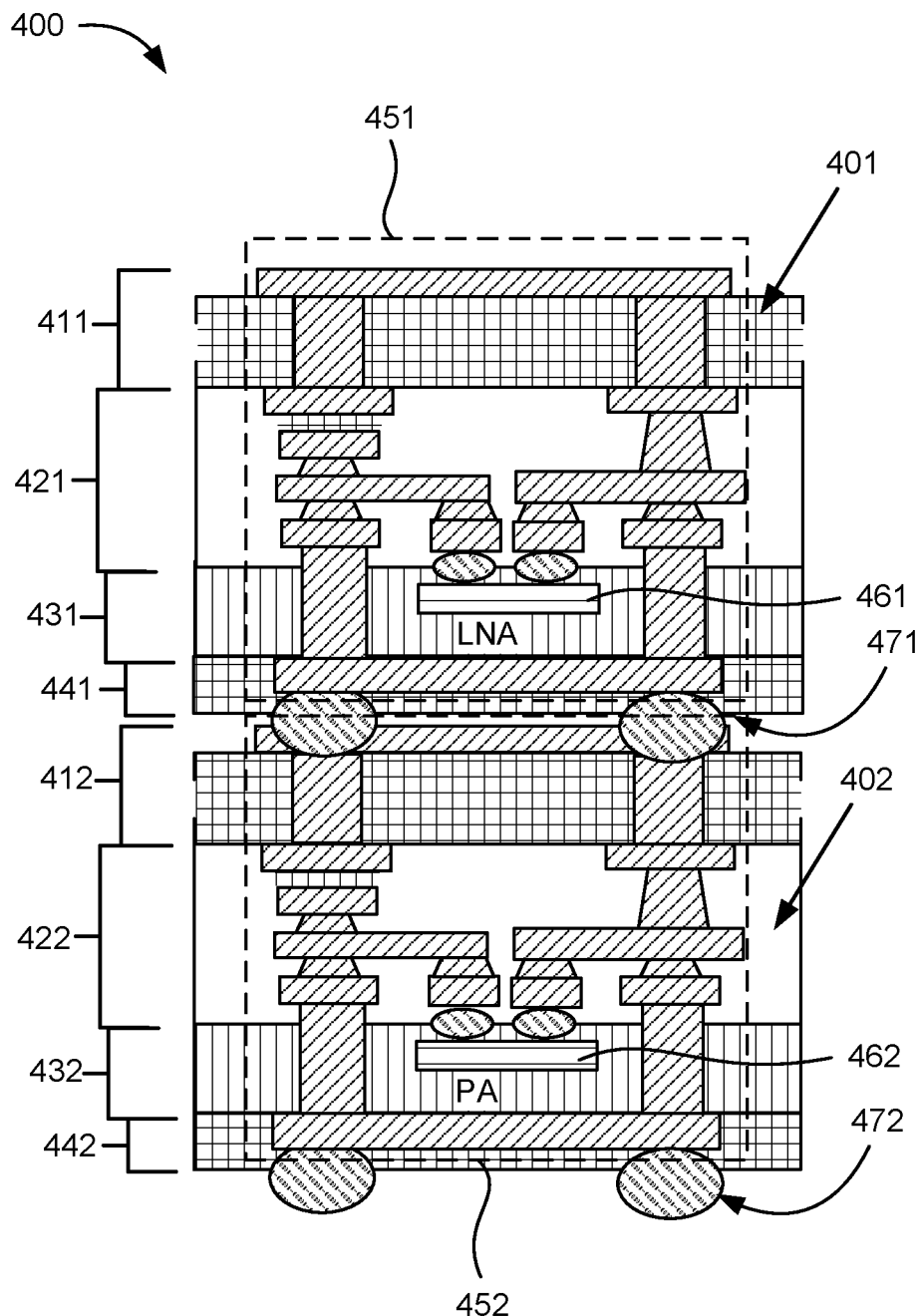
FIG. 4 illustrates a portion of an apparatus including a first device, a first die, a second device, and a second die in accordance with at least one aspect of the disclosure.

FIG. 4 illustrates a portion of an apparatus 400 including a first device 401 (e.g., semiconductor device, integrated circuit, IPD, etc.), a first die 461, second device 402 (e.g., semiconductor device, integrated circuit, IPD, etc.), and a second die 462 in accordance with at least one aspect of the disclosure. The first device 401 and the second device 402 have some features similar to devices 101, 201 and 301 discussed in the foregoing, so a detailed repetition of all similar aspects will not be provided. The first device 401 may comprise a top substrate 411, a middle substrate 421 and a bottom substrate 441. The top substrate 411 is disposed on the middle substrate 421. The bottom substrate 441 is electrically coupled to the middle substrate 421 by connectors 431 on a side of the middle substrate 421 opposite the top substrate 411. The first device 401 may include a first inductor 451 formed in portions of the top substrate 411, middle substrate 421 and bottom substrate 441, as discussed herein. The first die 461 is coupled to the middle substrate 421 and disposed within the first inductor 451. A plurality of first interconnectors 471 may be used to couple the first device 401 to other components. In the illustrated aspect, the first device 401 is coupled to the second device 402 by the plurality of first interconnectors 471.

The second device 402 may comprise a top substrate 412, a middle substrate 422 and a bottom substrate 442. The top substrate 412 is disposed on the middle substrate 422. The bottom substrate 442 is electrically coupled to the middle substrate 422 by connectors 432 on a side of the middle substrate 422 opposite the top substrate 412. The second device 402 may include a second inductor 452 formed in portions of the top substrate 412, middle substrate 422 and bottom substrate 442, as discussed herein. The second die 462 is coupled to the middle substrate 422 and disposed within the second inductor 452. A plurality of second interconnectors 472 may be used to couple the second device 402 to other components. In the illustrated aspect, it will be appreciated that the first device 401 and the second device 402 may be packaged in a single package, with the plurality of second interconnectors 472 providing connections to external components and the plurality of first interconnectors 471 providing connections for signals and/or power between the first device 401 and the second device 402, which allows for coupling of signals and/or power to the first die 461 and the second die 462, respectively.

In some aspects may the first device 401 and the second device 402 may each be configured as a radio frequency (RF) filter. In some aspects, the second die 462 may be a power amplifier (PA) and the second device 402 may be configured as a transmit (Tx) filter. In some aspects, the first die 462 may be a low noise amplifier (LNA) and the first device 401 may be configured as receive (Rx) filter. Accordingly, in some aspects, the apparatus 400 may be radio frequency front end (RFFE) module and include both transmit and receive components in a compact stacked configuration, similar to a package on package (POP) device.

In order to fully illustrate aspects of the design of the present disclosure, methods of fabrication are presented. Other methods of fabrication are possible and the discussed fabrication methods are presented only to aid understanding of the concepts disclosed herein.

FIGS. 5A-D illustrate portions of a fabrication process for apparatus 500 in accordance with one or more aspects of the disclosure. The process may begin in FIG. 5A with the fabrication of the through vias 515 in the top substrate 510 to a first top metal layer M1(a). The substrate 510 may comprise glass (e.g., pre-preg), silicon, ceramic, or epoxy molding compound (EMC), e.g., a thru-mold-via type substrate. In some aspects, the substrate 510 may be purchased or provided with the through vias 515 prefabricated. The process may continue in FIG. 5B with the top substrate 510 having a plurality of vias 515 coupled to the first top metal layer M1(a). In this portion of the process, a carrier 506 may be attached to the top substrate 510 using an adhesive 507.

Figure 5A:
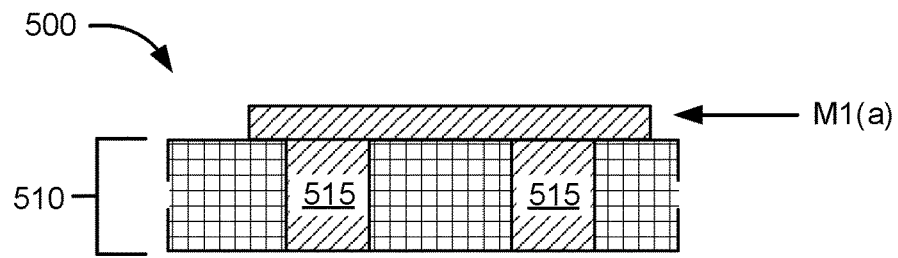
FIGS. 5A-5D illustrate portions of a fabrication process for an apparatus in accordance with one or more aspects of the disclosure.
Figure 5B:
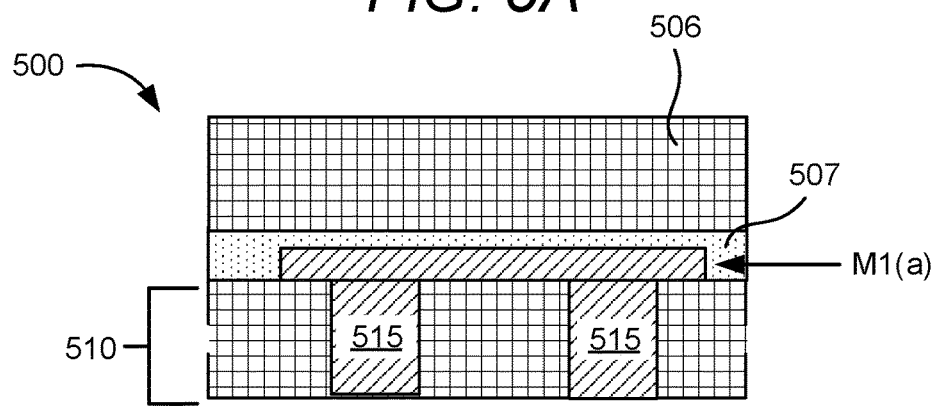
Figure 5C:
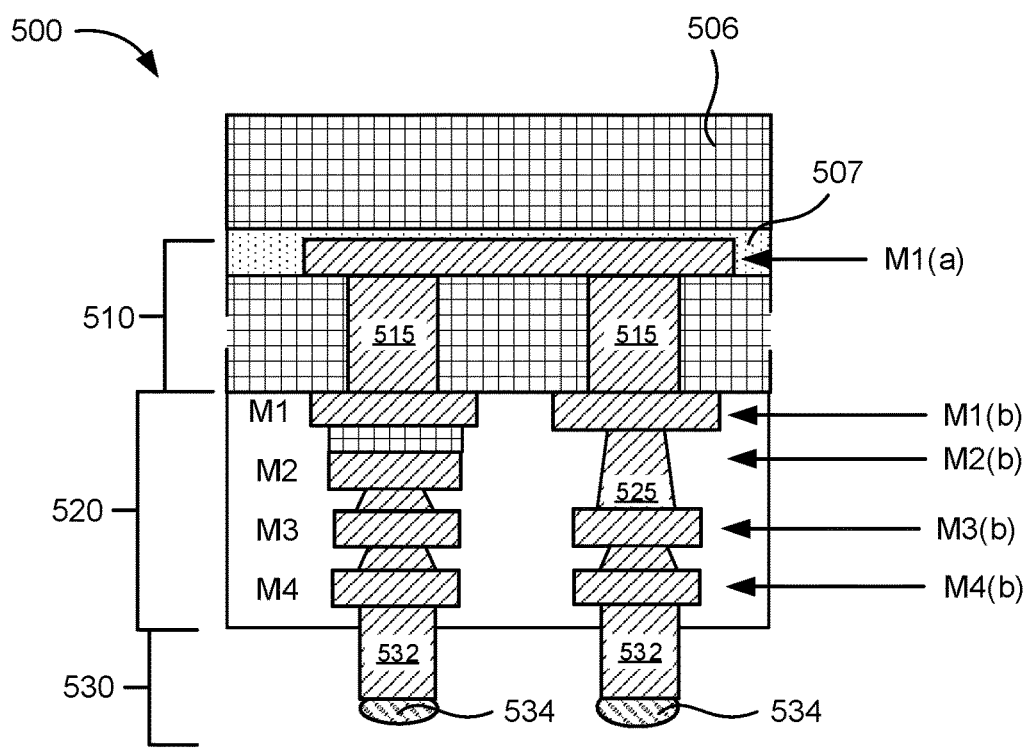

The process may continue in FIG. 5C with the top substrate 510 having a plurality of vias 515 coupled to the first top metal layer M1(a) attached to the carrier 506 by adhesive 507. In this portion of the process, a middle substrate 520 and connectors 530 may be fabricated using conventional techniques. Accordingly, details of each of the fabrication portions will not be discussed herein. In some aspects, the first metal layer M1(b) may be formed as a metal layer by semi additive process (SAP), damascene plating or other suitable metal layer fabrication process. One or more dielectric layers may be deposited on the first metal layer M1(b). The one or more dielectric layers may comprise Silicon Nitride (SiN) and/or a dielectric, such as, silicon nitride (Si3N4), silicon oxide (SiO2), tantalum oxide (Ta2O5), aluminum oxide (Al2O3) and similar materials for the MIM capacitor (not illustrated). The process can continue with formation a second metal layer M2(b) using SAP or other suitable metal layer fabrication process. The second metal layer M2(b) may be used in part for the MIM capacitor top electrode. Vias (e.g., 525) may be formed in the middle substrate 520 to couple each metal layer using conventional techniques, so further details will not be provided.

The process can continue with the deposition, patterning and curing of the first interlayer dielectric. The first interlayer dielectric may comprise a polyimide (PI), polybenzoxazole. (PBO), benzocyclobuten (BCB), or other suitable dielectric. It will be appreciated that if a MIM capacitor is not included in the design, the process may include an interlayer dielectric being deposed on the first metal layer M1(b). The process can continue with formation a third metal layer M3(b) using SAP or other suitable metal layer fabrication process. The third metal layer M3(b) may be used in part for forming one or more inductors and/or for routing/interconnections. The process can continue with the deposition, patterning and curing of a second interlayer dielectric. The second interlayer dielectric may comprise a polyimide (PI) or other suitable dielectric. The process can continue with formation a fourth metal layer M4(b) using SAP or other suitable metal layer fabrication process. The fourth metal layer M4(b) may be used in part for forming one or more inductors and/or for routing/interconnections. The process can continue with the deposition, patterning and curing of a third interlayer dielectric. The second interlayer dielectric may comprise a polyimide (PI) or other suitable dielectric and in the illustrated aspect may be the final passivation dielectric. The process may continue with a conventional under bump metallization (UBM) fabrication to form UBMs (not illustrated) for the connectors 530. The connectors 530 may be formed by forming conductive (e.g., Cu) pillars 532 and a solder plating and reflow process to form the solder portions 534.

Figure 5D:
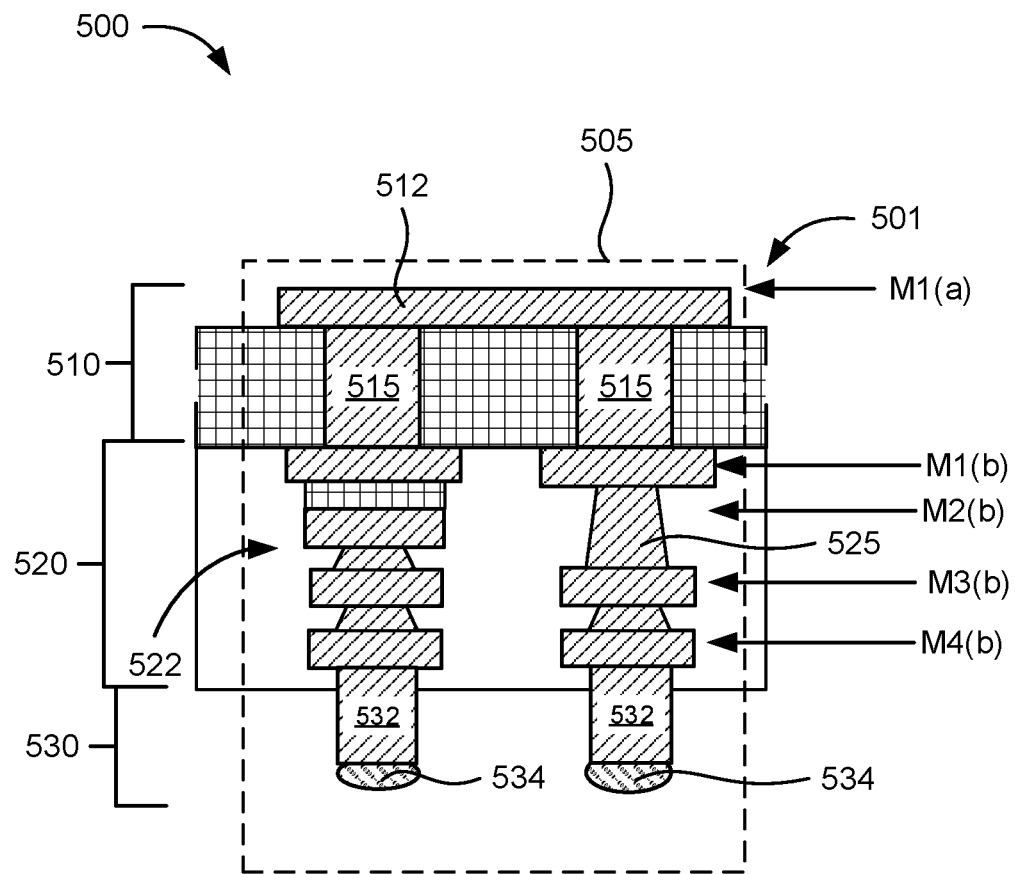

The process may continue in FIG. 5D with the carrier 506 and adhesive 507 being removed and dicing being performed to former individual devices 501 from a wafer, which form a portion of an apparatus 500 that included the device 501. The device 501 has some features similar to the foregoing devices 101, 201 and 301, so a detailed repetition of all similar aspects will not be provided. The device 501 may comprise a top substrate 510, and a middle substrate 520. A bottom substrate is not expressly illustrated but may be only one metal layer to complete the bottom winding portion of the first inductor 505. The top substrate 510 may include a plurality of top vias 515 coupled to a top winding portion 512 of a first inductor 505 formed in a first top metal layer, e.g., M1(a). It will be appreciated that during the fabrication process (e.g., plating, etc.) the various metal traces can be formed on each metal layer and the layers coupled by vias (e.g., 515 and 525) and the connectors 530 to form the first inductor 505.

The top substrate 510 is disposed on the middle substrate 320. The middle substrate 520 can include a plurality of middle vias 525 and a plurality of middle metal layers (e.g., M1(b), M2(b), M3(b) and M4(b)). The plurality of middle vias 525 and the plurality of middle metal layers form a middle winding portion 522 of the first inductor 305. It will be appreciated that other components (such as MIM capacitors and inductors) may be coupled to one or more of the plurality of middle vias 525 and plurality of middle metal layers, e.g., M1(b)-M4(b). A plurality of connectors 530 may each include a conductive pillar 532 and a solder portion 534, which can be used to connect to a metal layer (not illustrated) that can form the bottom winding portion of the inductor 505. The bottom winding portion may be formed in a third substrate, which may be a laminate substrate with one or more metal layers, as discussed herein.

FIGS. 6A-K illustrate portions of a fabrication process for apparatus 600 in accordance with one or more aspects of the disclosure. The process may begin in FIG. 6A with the fabrication of the through vias 615 in the top substrate 610 to a first top metal layer M1(a). The substrate 610 may comprise glass (e.g., pre-preg), silicon or ceramic. In some aspects, the substrate 610 may be purchased or provided with the through vias 615 prefabricated. The process may continue in FIG. 6B with the top substrate 610 having a plurality of vias 615 coupled to the first top metal layer M1(a). In this portion of the process, a carrier 606 may be attached to the top substrate 610 using an adhesive 607.

Figure 6A:
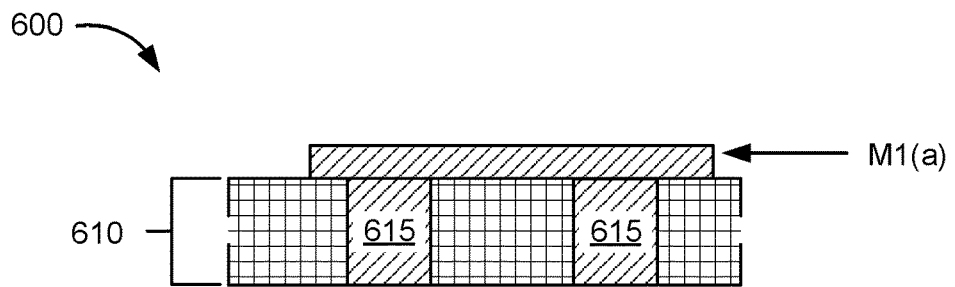
FIGS. 6A-6J illustrate portions of a fabrication process for an apparatus in accordance with one or more aspects of the disclosure.
Figure 6B:
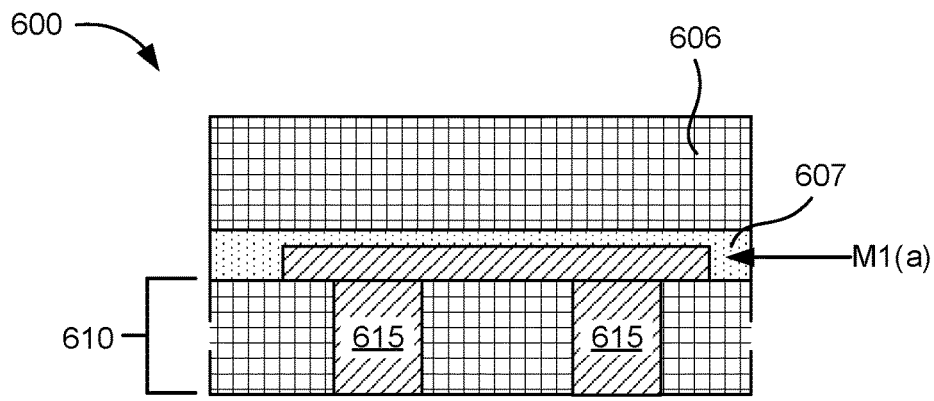
Figure 6C:
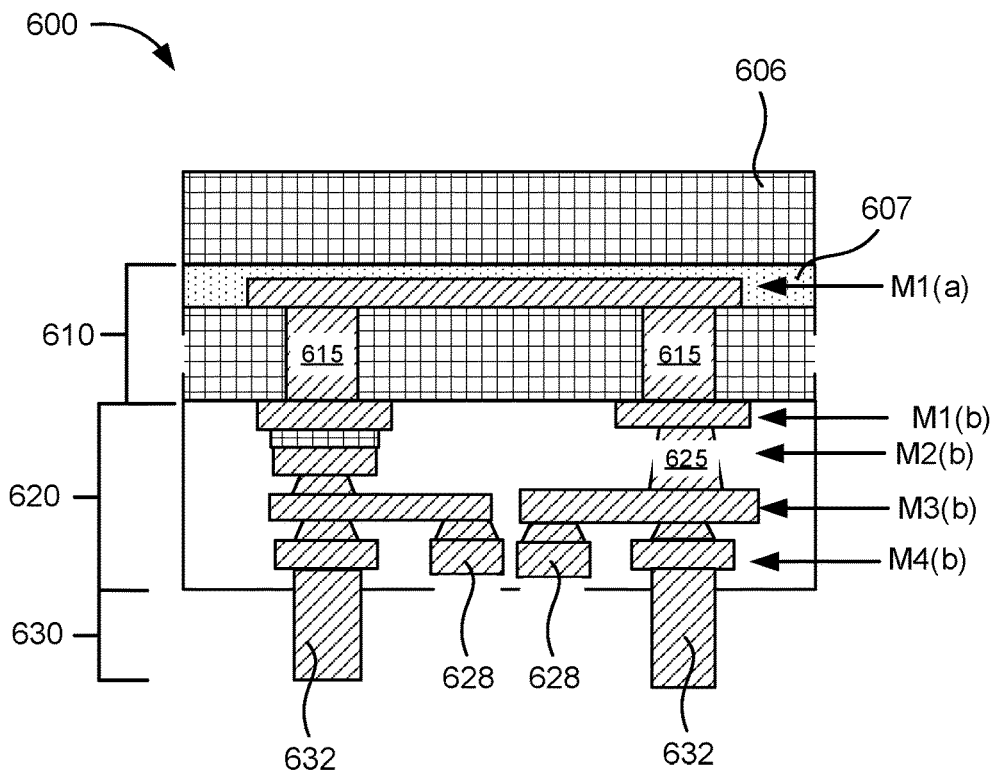

The process may continue in FIG. 6C with the top substrate 610 having a plurality of vias 615 coupled to the first top metal layer M1(a) attached to the carrier 606 by adhesive 607. In this portion of the process, a middle substrate 620 and connectors 630 may be fabricated using conventional techniques. Accordingly, details of each of the fabrication portions will not be discussed herein. Further, it will be appreciated that the fabrication of the middle substrate 620 is similar to that of substrate 520 discussed above, in relation to FIG. 5C, so only a summary of the process will be described to avoid redundancies. In some aspects, the first metal layer M1(b), the second metal layer M2(b), the third metal layer M3(b) and the fourth metal layer M4(b) be formed as metal layers by semi additive process (SAP) plating or other suitable metal layer fabrication process, as discussed above. Further, as discussed above one or more dielectric layers may be deposited on the first metal layers. Vias (e.g., via 625) may be formed in the middle substrate 620 to couple each metal layer using conventional techniques, so further details will not be provided. A conventional UBM fabrication process can be used to form UBMs (not illustrated) for the connectors 630. The connectors 630 may be formed by forming conductive (e.g., Cu) pillars 632, in this process without adding a solder portion. Likewise, in this process different from the foregoing process, there are pads 628 formed to facilitate connection to a die.

Figure 6D:
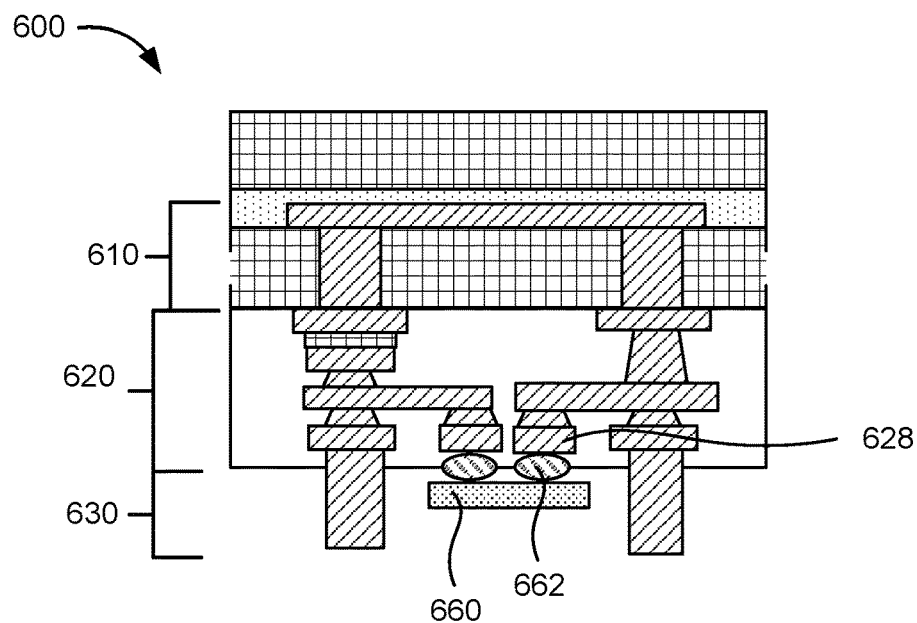

The process may continue in FIG. 6D with the top substrate 610 attached to the carrier 606 by adhesive 607. The middle substrate 620 is formed on the top substrate 610 and the connectors 630 are formed on the middle substrate. In this portion of the process the die 660 is attached to the middle substrate 620. In some aspects, a plurality of die connectors 662 (e.g., solder balls, bumps, etc.) may be used to couple the die 660 to pads 628 in the middle substrate 620 to provide an electrical and physical connection from the die 660 to the middle substrate 620.

Figure 6E:
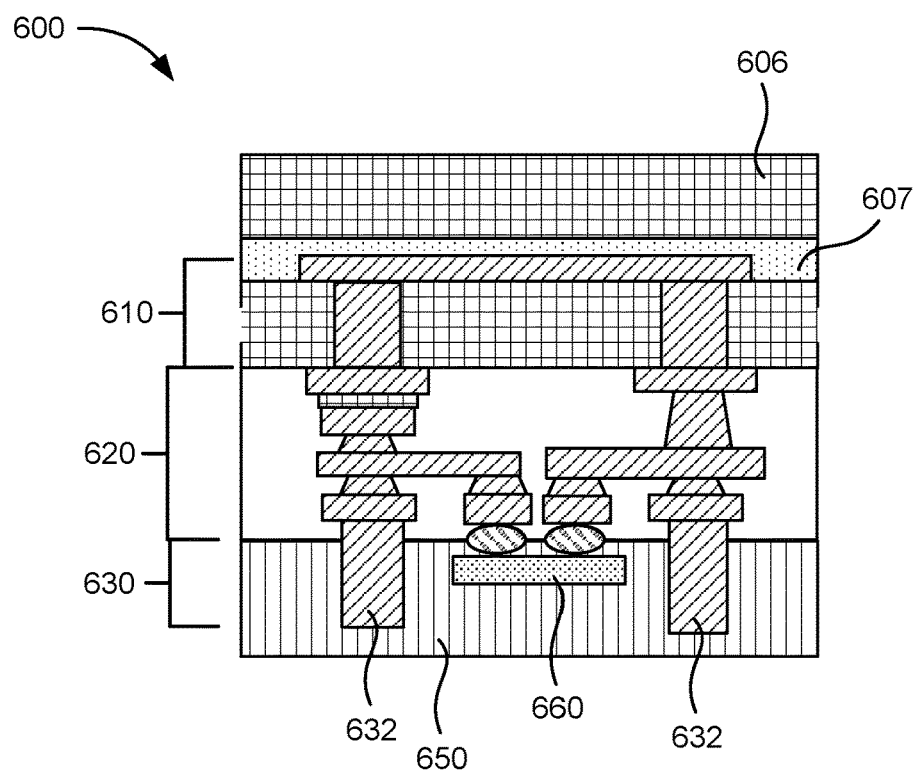

The process may continue in FIG. 6E with the top substrate 610 attached to the carrier 606 by adhesive 607. The middle substrate 620 is formed on the top substrate 610 and the connectors 630 are formed on the middle substrate. The die 660 is attached to the middle substrate 620. In this portion of the process, the die 660 and conductive pillars 632 are embedded in a mold portion 650, which may be formed by depositing a mold compound over the conductive pillars 632 and die 660.

Figure 6F:
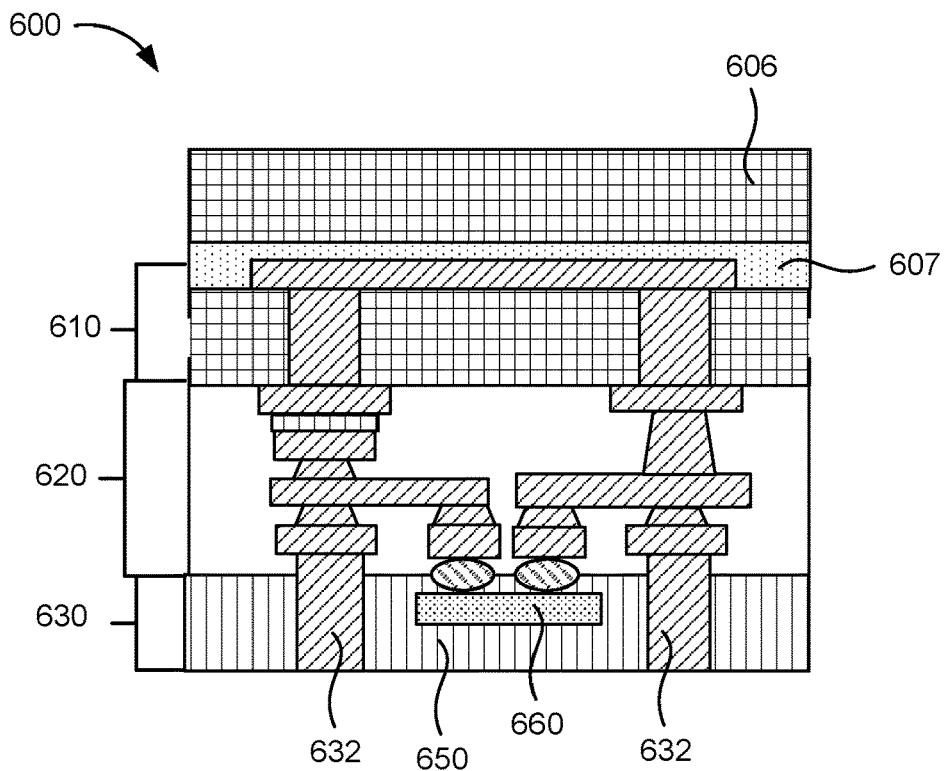

The process may continue in FIG. 6F with the top substrate 610 attached to the carrier 606 by adhesive 607. The middle substrate 620 is formed on the top substrate 610 and the connectors 630 are formed on the middle substrate. The die 660 is attached to the middle substrate 620 and mold portion 650 is deposit over the connectors 630 and die 660. In this portion of the process, the mold portion 650 is ground down to planarize the bottom surface and expose the connectors 630 (e.g., pillars 632).

Figure 6G:
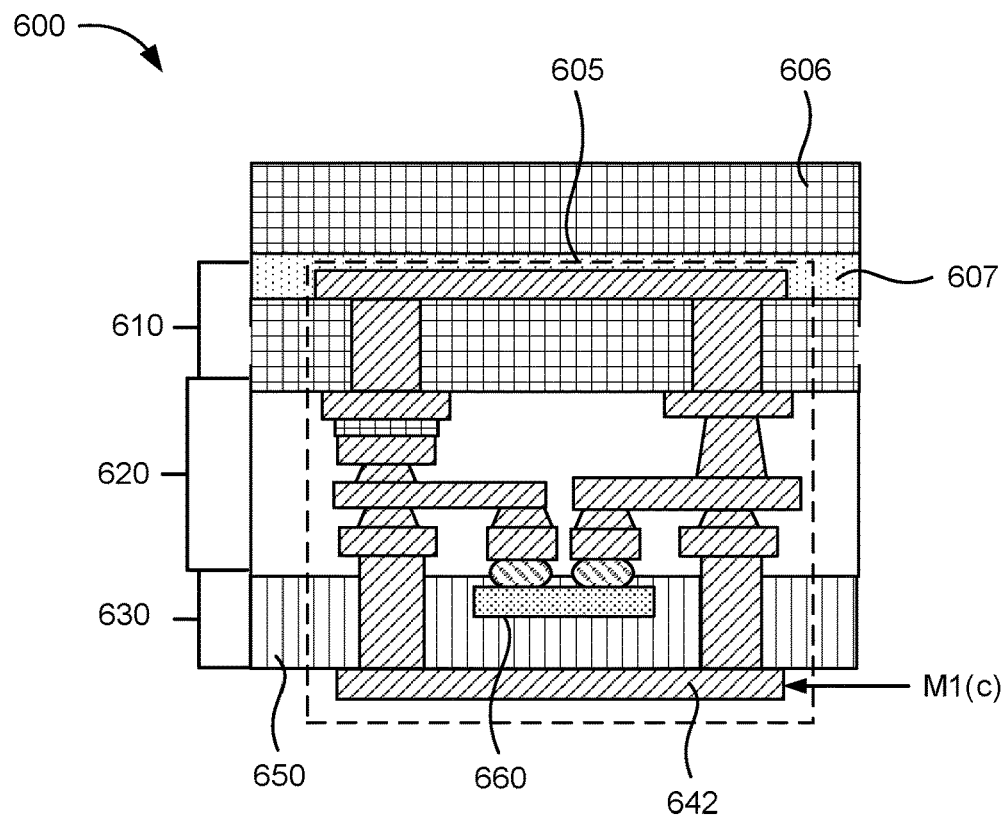

The process may continue in FIG. 6G with the top substrate 610 attached to the carrier 606 by adhesive 607. The middle substrate 620 is formed on the top substrate 610 and the connectors 630 are formed on the middle substrate. The die 660 is attached to the middle substrate 620 and mold portion 650 is deposit over the connectors 630 and die 660. In this portion of the process, a first bottom metal layer M1(c) may be formed and a portion of M1(c) may be used to form the bottom portion 642 of inductor 605.

Figure 6H:
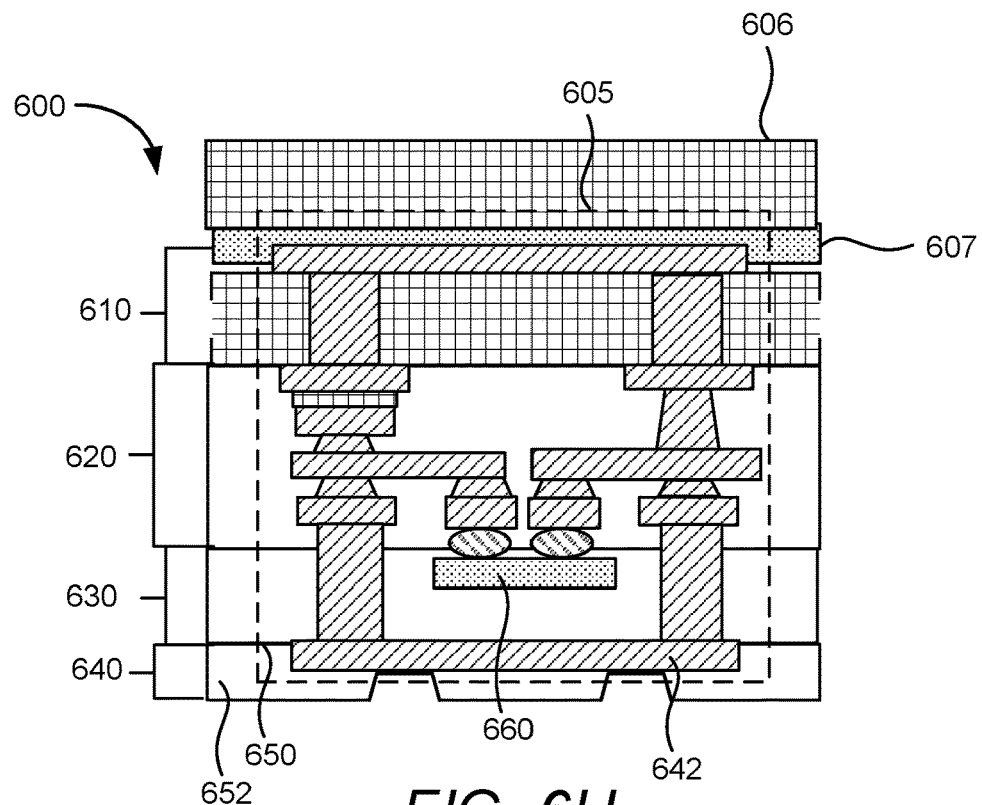

The process may continue in FIG. 6H with the top substrate 610 attached to the carrier 606 by adhesive 607. The middle substrate 620 is formed on the top substrate 610 and the connectors 630 are formed on the middle substrate. The die 660 is attached to the middle substrate 620 and mold portion 650 is deposit over the connectors 630 and die 660. Additionally, the bottom portion 642 of inductor 605 is formed. In this portion of the process, a bottom passivation layer 652 (e.g., an interlayer dielectric) may be deposited over the bottom portion 642 of inductor 605 and any exposed portions of the mold 650. The bottom passivation layer 652 may comprise a polyimide (PI) or other suitable dielectric and in the illustrated aspect may be the final passivation dielectric. The bottom passivation layer 652 may be patterned to form cavities for connection to the first bottom metal layer M1(c) including the bottom portion 642 of inductor 605. In some aspects, the first bottom metal layer M1(c) and bottom passivation layer 652 may form a bottom substrate 640. It will be appreciated that in some aspects, more than one bottom metal layer may be included with corresponding interlayer dielectric layers to separate and insulate the bottom metal layers. Further, in some aspects, the bottom portion 642, may be formed in a layer of a multilayer laminated board (e.g., using a conventional redistribution layer (RDL) processing), or any suitable substrate with at least one metal layer.

Figure 6I:
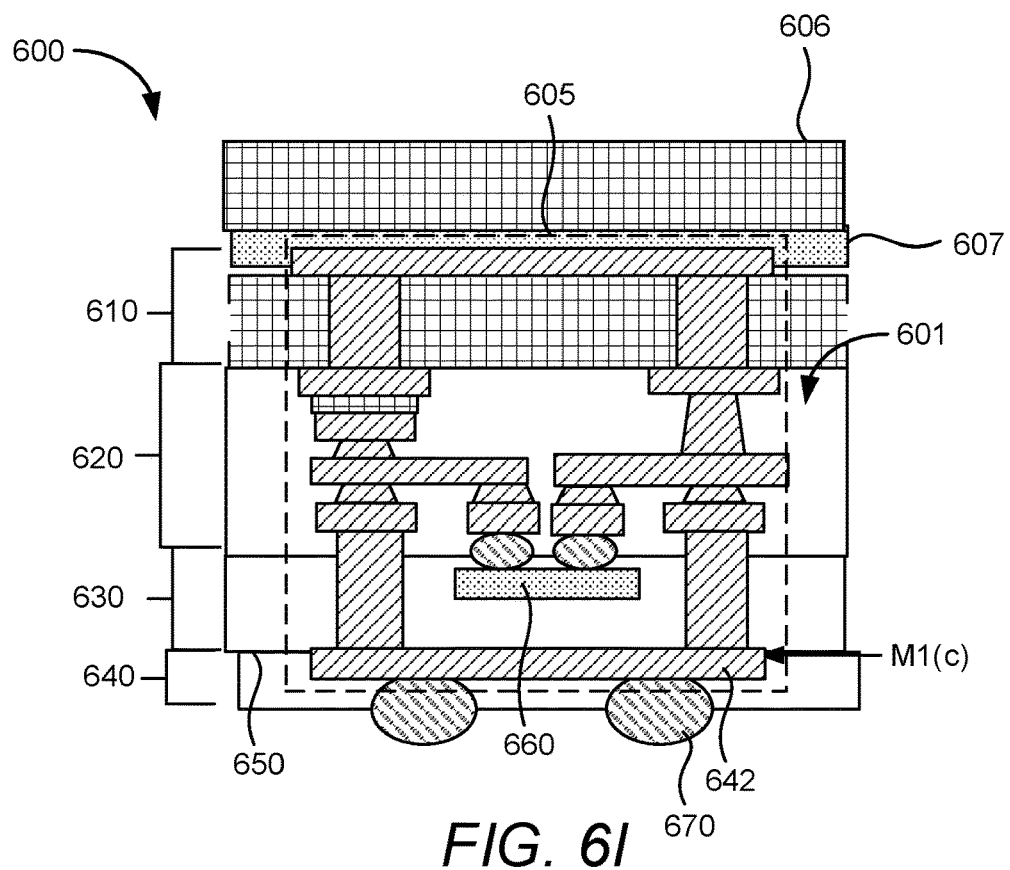

The process may continue in FIG. 6I with the top substrate 610 attached to the carrier 606 by adhesive 607. The middle substrate 620 is formed on the top substrate 610 and the connectors 630 are formed on the middle substrate. The die 660 is attached to the middle substrate 620 and mold portion 650 is deposit over the connectors 630 and die 660. Additionally, the bottom portion 642 of inductor 605 is formed along with the bottom passivation layer 652. In this portion of the process, a ball grid array (BGA) may be formed on the bottom of the device 601 by solder balls 670 placement/reflow process.

Figure 6J:
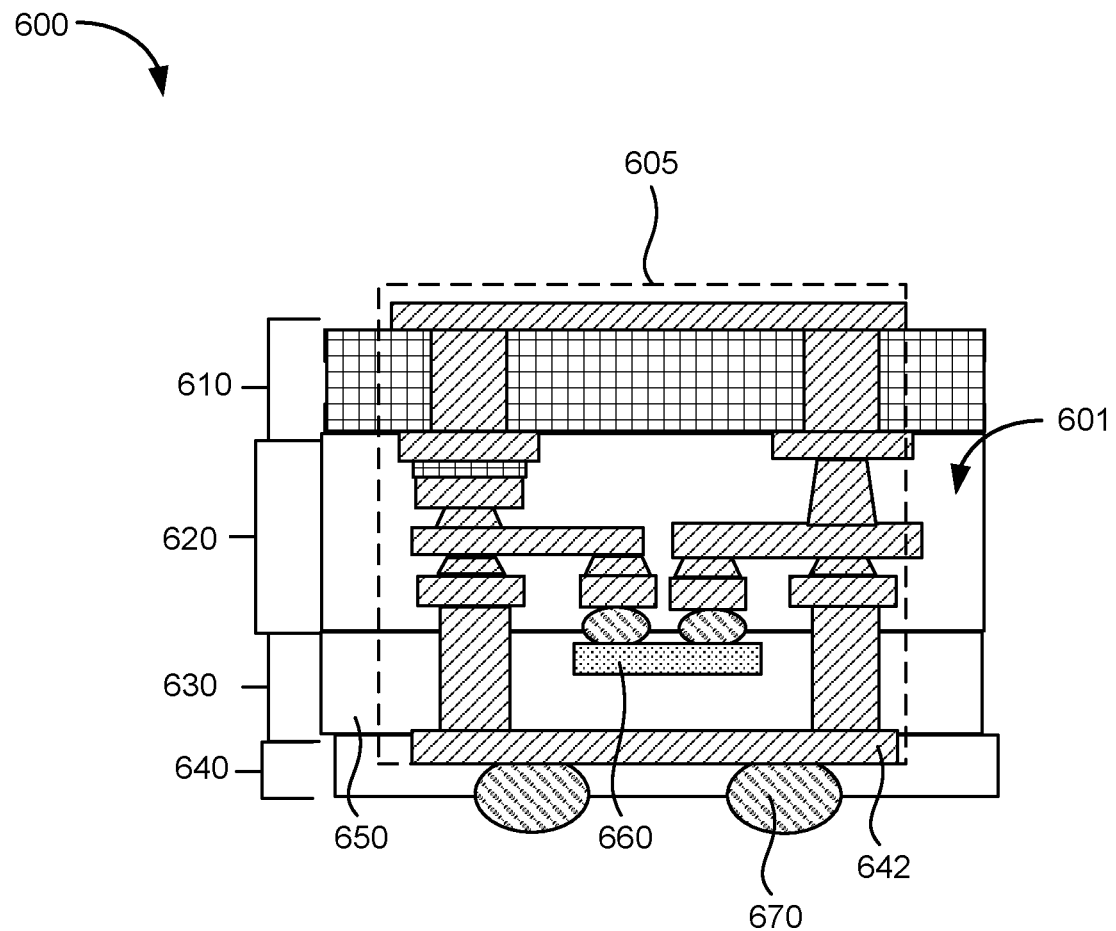

The process may continue in FIG. 6J with the middle substrate 620 is formed on the top substrate 610 and the connectors 630 are formed on the middle substrate. The die 660 is attached to the middle substrate 620 and mold portion 650 is deposit over the connectors 630 and die 660. Additionally, the bottom portion 642 of inductor 605 is formed along with the bottom passivation layer 652 and solder balls 670. In this portion of the process, the carrier 606 and adhesive 607 is removed and dicing being performed to former individual devices 601 from a wafer, which form a portion of an apparatus 600 that included the device 601, similar to the prior devices discussed in the foregoing description.

Figure 7:
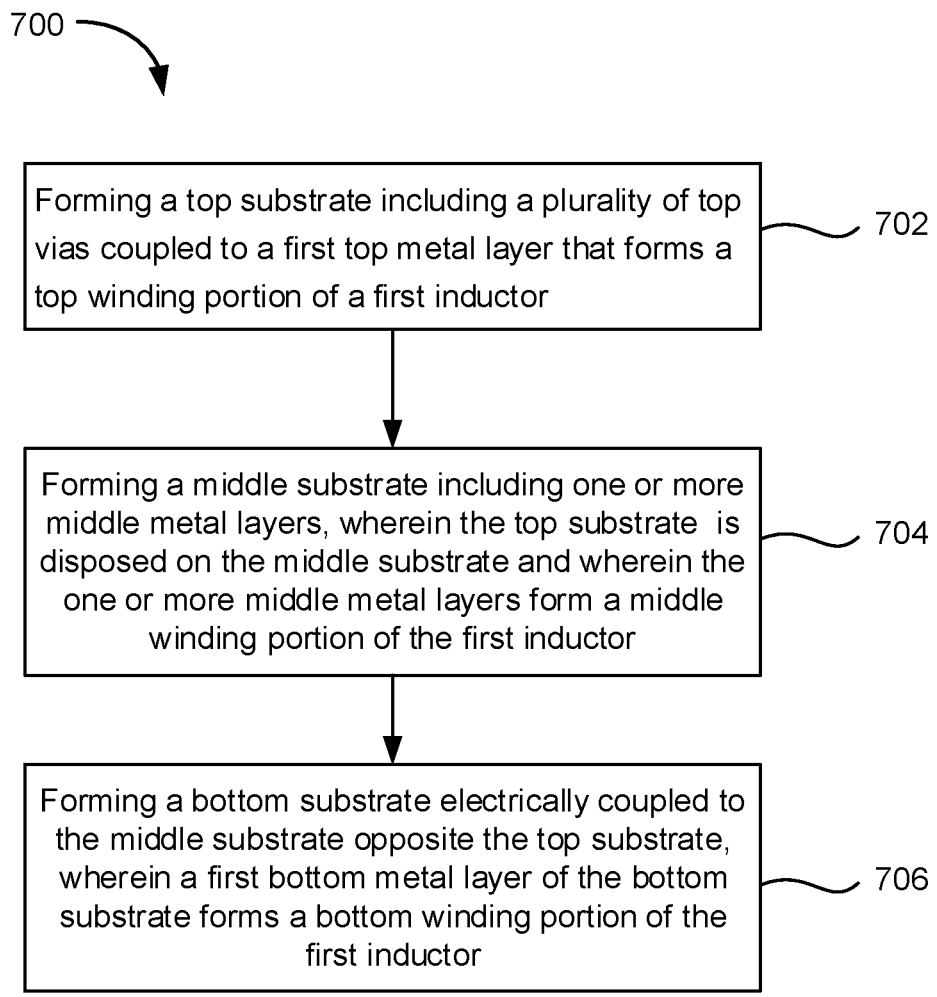
FIG. 7 illustrates a flowchart of a method for fabricating a device in accordance with one or more aspects of the disclosure.

FIG. 7 illustrates a flowchart of a method 700 for fabricating a device in accordance with one or more aspects of the disclosure. It will be appreciated from the foregoing disclosure that additional processes for fabricating the various aspects disclosed herein will be apparent to those skilled in the art and a literal rendition of the processes discussed above will not be provided or illustrated in the included drawings. It will be appreciated that the sequence of the fabrication processes is not necessarily in any order and later processes may be discussed earlier to provide an example of the breadth of the various aspects disclosed.

Referring to FIG. 7, a simplified process is provided to outline broad process/actions to be performed in accordance with one or more aspects disclosed. The process can begin in 702 with forming a top substrate (e.g., 110, 210, 310, etc.) including a plurality of top vias (e.g., 115, 215, 315, etc.) coupled to a first top metal layer that forms a top winding portion (e.g., 112, 212, 312, etc.) of a first inductor (e.g., 105, 205, 305, etc.). The process continues in 704 with forming a middle substrate (e.g., 120, 220, 320, etc.) including one or more middle metal layers, wherein the top substrate (e.g., 115, 215, 315, etc.) is disposed on the middle substrate (e.g., 120, 220, 320, etc.) and wherein the one or more middle metal layers form a middle winding portion (e.g., 122, 222, 322, etc.) of the first inductor. The process continues in 706 with forming a bottom substrate (e.g., 140, 240, 340, etc.) electrically coupled to the middle substrate (e.g., 120, 220, 320, etc.) opposite the top substrate (e.g., 110, 210, 310, etc.), wherein a first bottom metal layer of the bottom substrate (e.g., 140, 240, 340, etc.) forms a bottom winding portion (e.g., 142, 242, 342, etc.) of the first inductor (e.g., 105, 205, 305, etc.).

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 8:
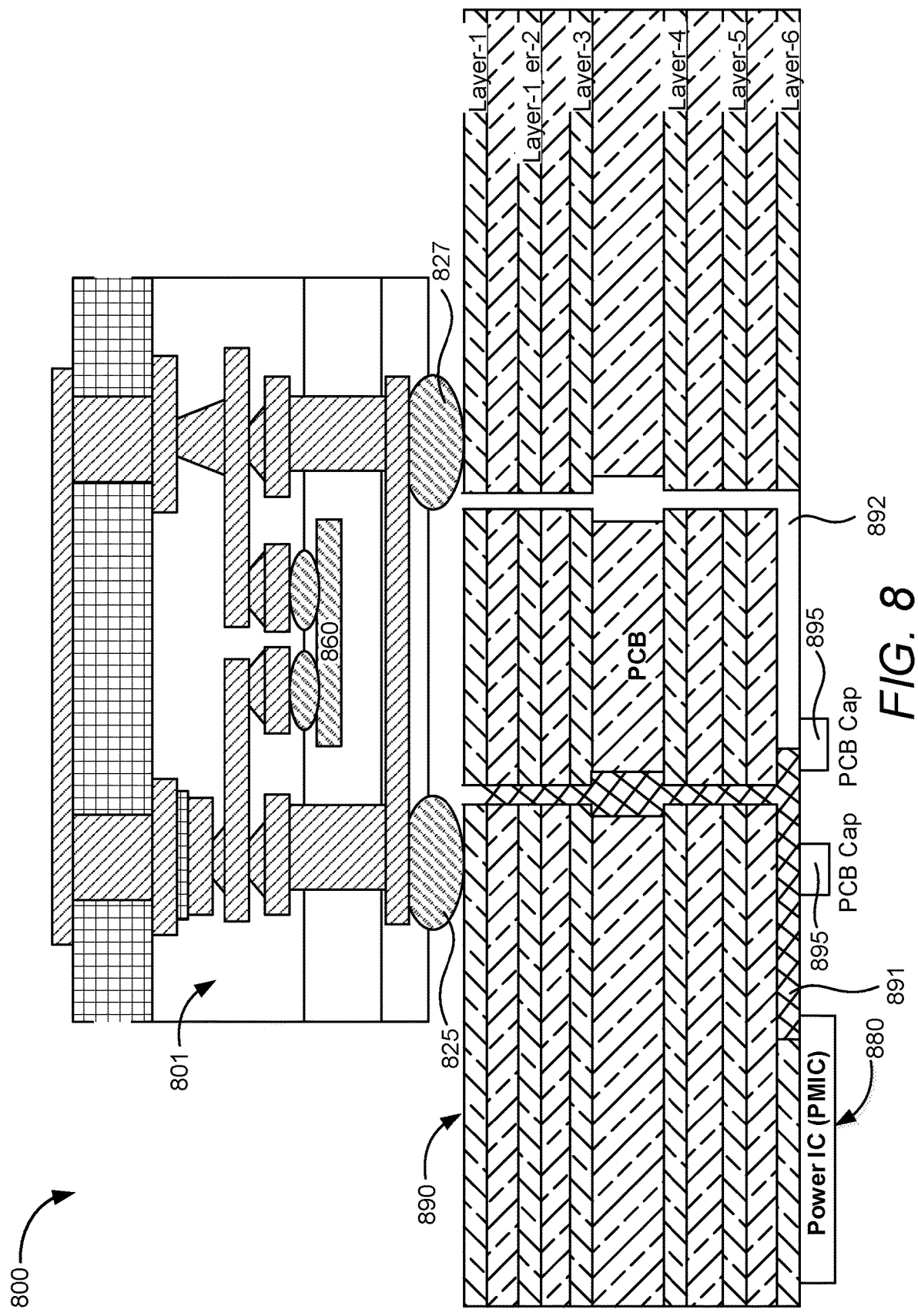
FIG. 8 illustrates components of an integrated device in accordance with one or more aspects of the disclosure.

FIG. 8 illustrates components of an apparatus 800 according to one or more aspects of the disclosure. Regardless of the various configurations of the devices (e.g., 101, 201, 301, etc.) discussed above, it will be appreciated that the device 801 may be configured to couple to a printed circuit board (PCB) 890. The PCB 890 is also coupled to a power supply 880 (e.g., a power management integrated circuit (PMIC)), which allows the device to be electrically coupled to the PMIC 880. Specifically, one or more power supply (VDD) lines 891 and one or more ground (GND) lines 892 may be coupled to the PMIC 880 to distribute power to the PCB 890 and device 801 via VDD BGA pin 825 and GND BGA pin 827 and to the die 860 via the device 801. The VDD line 891 and GND line 892 each may be formed from traces, shapes, or patterns in one or more metal layers of the PCB 890 (e.g., layers 1-6) coupled by one or more vias through insulating layers separating the metal layers 1-6 in the PCB 890. The PCB 890 may have one or more PCB capacitors (PCB cap) 895 that can be used to condition the power supply signals, as is known to those skilled in the art. Additional connections and devices may be coupled to and/or pass through the PCB 890 to the device 801 via one or more additional BGA pins (not illustrated) on the device 801. It will be appreciated that the illustrated configuration and descriptions are provided merely to aid in the explanation of the various aspects disclosed herein. For example, the PCB 890 may have more or less metal and insulating layers, there may be multiple lines providing power to the various components, etc. Accordingly, the forgoing illustrative examples and associated figures should not be construed to limit the various aspects disclosed and claimed herein.

Figure 9:
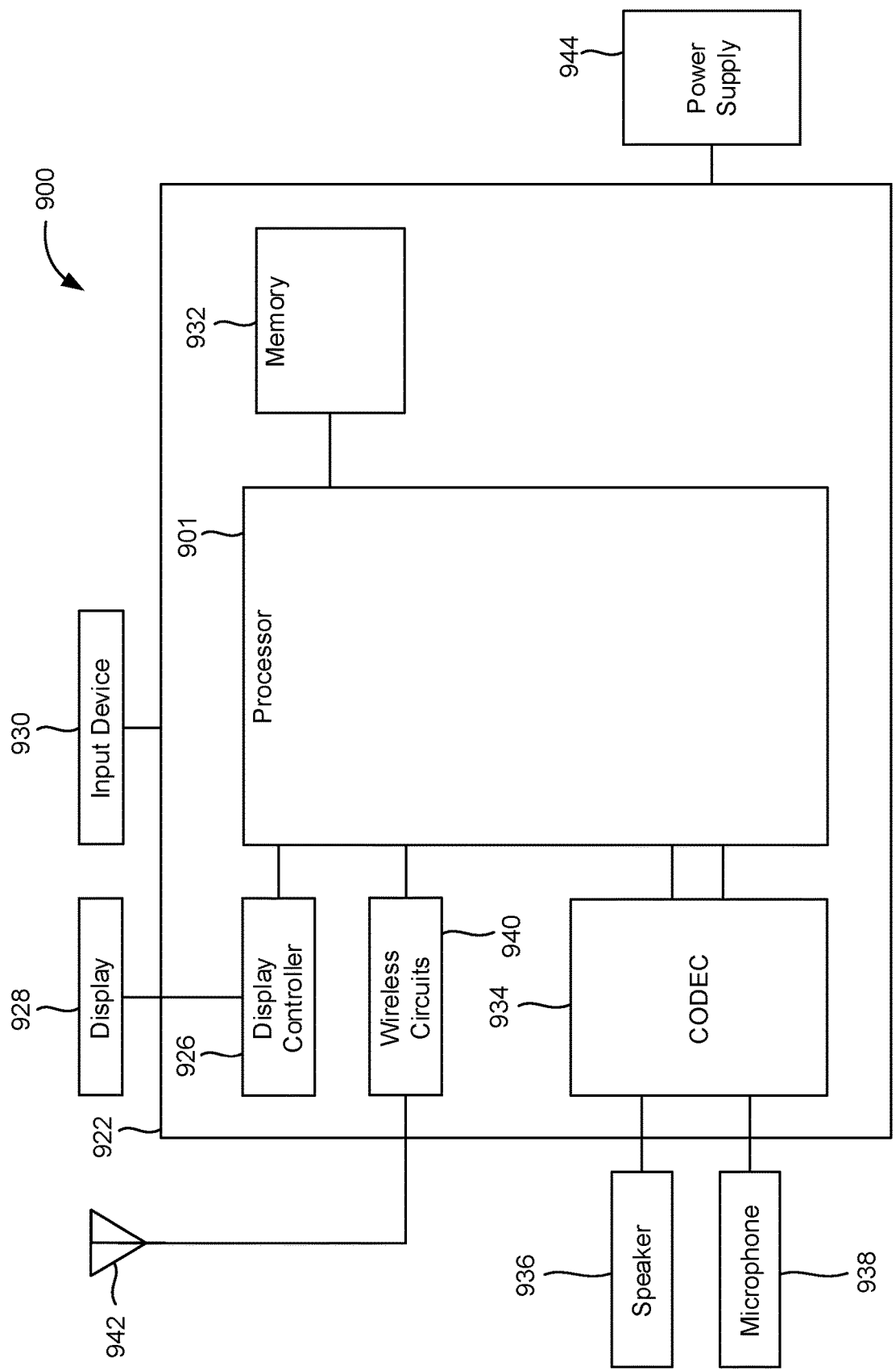
FIG. 9 illustrates an exemplary mobile device in accordance with one or more aspects of the disclosure.

FIG. 9 illustrates an exemplary mobile device in accordance with some examples of the disclosure. Referring now to FIG. 9, a block diagram of a mobile device that is configured according to exemplary aspects is depicted and generally designated mobile device 900. In some aspects, mobile device 900 may be configured as a wireless communication device. As shown, mobile device 900 includes processor 901. Processor 901 may be communicatively coupled to memory 932 over a link, which may be a die-to-die or chip-to-chip link. Mobile device 900 also includes display 928 and display controller 926, with display controller 926 coupled to processor 901 and to display 928.

In some aspects, FIG. 9 may include coder/decoder (CODEC) 934 (e.g., an audio and/or voice CODEC) coupled to processor 901; speaker 936 and microphone 938 coupled to CODEC 934; and wireless circuits 940 (which may include a modem, RF circuitry, filters, etc., which may be implemented using one or more devices (e.g., 101, 201, 301, etc.), as disclosed herein) coupled to wireless antenna 942 and to processor 901.

In a particular aspect, where one or more of the above-mentioned blocks are present, processor 901, display controller 926, memory 932, CODEC 1234, and wireless circuits 940 can be included in a system-in-package or system-on-chip device 922 which may be implemented in part using the devices disclosed herein. Input device 930 (e.g., physical, or virtual keyboard), power supply 944 (e.g., battery), display 928, input device 930, speaker 936, microphone 938, wireless antenna 942, and power supply 944 may be external to system-on-chip device 922 and may be coupled to a component of system-on-chip device 922, such as an interface or a controller.

It should be noted that although FIG. 9 depicts a mobile device 900, processor 901 and memory 932 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
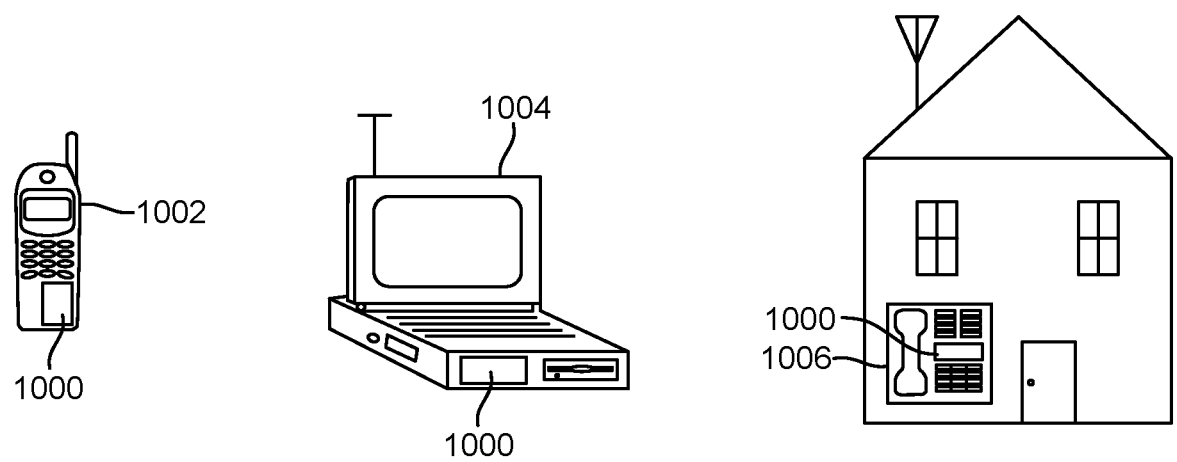
FIG. 10 illustrates various electronic devices that may be integrated with any of the aforementioned devices in accordance with one or more aspects of the disclosure.

FIG. 10 illustrates various electronic devices that may be integrated with any of the aforementioned integrated device or device accordance with various examples of the disclosure. For example, a mobile phone device 1002, a laptop computer device 1004, and a fixed location terminal device 1006 may each be considered generally user equipment (UE) and may include a device 1000, as described herein. The device 1000 may be, for example, any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-10 may be rearranged and/or combined into a single component, process, feature, or function or incorporated in several components, processes, or functions. Additional elements, components, processes, and/or functions may also be added without departing from the disclosure. It should also be noted that FIGS. 1-10 and corresponding description in the present disclosure are not limited to dies and/or ICs. In some implementations, FIGS. 1-10 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising a device wherein the device comprises: a top substrate including a plurality of top vias coupled to a first top metal layer that forms a top winding portion of a first inductor; a middle substrate including one or more middle metal layers, wherein the top substrate is disposed on the middle substrate and wherein the one or more middle metal layers form a middle winding portion of the first inductor; and a bottom substrate electrically coupled to the middle substrate opposite the top substrate, wherein a first bottom metal layer of the bottom substrate forms a bottom winding portion of the first inductor.

Clause 2. The apparatus of clause 1, further comprising: a plurality of connectors configured to electrically couple the middle substrate to the bottom substrate.

Clause 3. The apparatus of clause 2, wherein each of the plurality of connectors comprises: a conductive pillar; and a solder portion, wherein the conductive pillar is coupled to the middle substrate and the solder portion is coupled to the bottom substrate.

Clause 4. The apparatus of any of clauses 1 to 3, wherein the first top metal layer is a top metal layer of the top substrate.

Clause 5. The apparatus of any of clauses 1 to 4, wherein the first bottom metal layer is a top metal layer of the bottom substrate.

Clause 6. The apparatus of any of clauses 1 to 5, further comprising: a mold portion configured to encapsulate at least the top substrate and the middle substrate.

Clause 7. The apparatus of any of clauses 1 to 6, further comprising: a die coupled to the bottom substrate.

Clause 8. The apparatus of clause 7, wherein the die is a power amplifier and the device is a transmit filter.

Clause 9. The apparatus of any of clauses 7 to 8, wherein the die is a low noise amplifier and the device is a receive filter.

Clause 10. The apparatus of any of clauses 1 to 9, further comprising: a die coupled to the middle substrate.

Clause 11. The apparatus of clause 10, wherein first inductor is disposed around the die.

Clause 12. The apparatus of any of clauses 10 to 11, wherein the die is a power amplifier and the device is a transmit filter.

Clause 13. The apparatus of any of clauses 10 to 12, wherein the die is a low noise amplifier and the device is a receive filter.

Clause 14. The apparatus of any of clauses 1 to 13, wherein the middle substrate further comprises: one or more metal-insulator-metal (MIM) capacitors; and one or more inductors.

Clause 15. The apparatus of clause 14, wherein the one or more MIM capacitors are formed or connected using a first middle metal layer and a second metal middle metal layer of the one or more middle metal layers, wherein the one or more inductors are formed using a third middle metal layer of the one or more middle metal layers, and wherein a spacing between the first middle metal layer and the second metal middle metal layer is less than a spacing between the second metal middle metal layer and the third middle metal layer.

Clause 16. The apparatus of any of clauses 14 to 15, wherein the one or more inductors are at least one of a two-dimensional (2D) inductor, a 2.5D inductor or a 3D inductor.

Clause 17. The apparatus of any of clauses 1 to 16 further comprising a second device, wherein the second device comprises: a second top substrate including a plurality of second top vias coupled to a second top metal layer that forms a second top winding portion of a second inductor; a second middle substrate including a plurality of second middle vias and a plurality of second middle metal layers, wherein the second top substrate is disposed on the second middle substrate and wherein the plurality of second middle vias and the plurality of second middle metal layers form a second middle winding portion of the second inductor; and a second bottom substrate electrically coupled to the second middle substrate opposite the second top substrate, wherein a first bottom metal layer of the second bottom substrate forms a second bottom winding portion of the second inductor.

Clause 18. The apparatus of clause 17, wherein the device is vertically stacked on the second device.

Clause 19. The apparatus of clause 18, further comprising: a first plurality of interconnectors configured to couple a bottom metal layer in the bottom substrate with the second top metal layer in the second top substrate; and a second plurality of interconnectors configured to couple a bottom metal layer in the second bottom substrate to external components.

Clause 20. The apparatus of any of clauses 17 to 19, further comprising: a first die coupled to the middle substrate; and a second die coupled to the second middle substrate.

Clause 21. The apparatus of clause 20, wherein the first die is a low noise power amplifier and the device is a transmit filter, and wherein the second die is a power amplifier and the second device is a transmit filter.

Clause 22. The apparatus of any of clauses 1 to 21, wherein the first inductor is three-dimensional (3D) inductor having serpentine windings.

Clause 23. The apparatus of any of clauses 1 to 22, wherein the top substrate further comprises at least one of glass, pre-preg, silicon, ceramic, or epoxy molding compound.

Clause 24. The apparatus of any of clauses 1 to 23, wherein the middle substrate further comprises a plurality of dielectric layers.

Clause 25. The apparatus of any of clauses 1 to 24, wherein the bottom substrate further comprises a laminate substrate having a plurality of metal layers.

Clause 26. The apparatus of any of clauses 1 to 25, wherein the apparatus selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

Clause 27. A method for forming a device comprising: forming a top substrate including a plurality of top vias coupled to a first top metal layer that forms a top winding portion of a first inductor; forming a middle substrate including one or more middle metal layers, wherein the top substrate is disposed on the middle substrate and wherein the one or more middle metal layers form a middle winding portion of the first inductor; and forming a bottom substrate electrically coupled to the middle substrate opposite the top substrate, wherein a first bottom metal layer of the bottom substrate forms a bottom winding portion of the first inductor.

Clause 28. The method of clause 27, further comprising: forming a plurality of connectors electrically coupling the middle substrate to the bottom substrate.

Clause 29. The method of any of clauses 27 to 28, further comprising: depositing a mold portion to encapsulate at least the top substrate and the middle substrate.

Clause 30. The method of any of clauses 27 to 29, further comprising: coupling a die to the bottom substrate.

Clause 31. The method of any of clauses 27 to 30, further comprising: coupling a die coupled to the middle substrate.

Clause 32. The method of clause 31, wherein first inductor is disposed around the die.

Clause 33. The method of any of clauses 27 to 32, wherein forming the middle substrate further comprises: forming one or more metal-insulator-metal (MIM) capacitors; and forming one or more inductors.

Clause 34. The method of any of clauses 27 to 33, further comprising forming a second device, wherein forming the second device comprises: forming a second top substrate including a plurality of second top vias coupled to a second top metal layer that forms a second top winding portion of a second inductor; forming a second middle substrate including a plurality of second middle vias and a plurality of second middle metal layers, wherein the second top substrate is disposed on the second middle substrate and wherein the plurality of second middle vias and the plurality of second middle metal layers form a second middle winding portion of the second inductor; and forming a second bottom substrate electrically coupled to the second middle substrate opposite the second top substrate, wherein a first bottom metal layer of the second bottom substrate forms a second bottom winding portion of the second inductor.

Clause 35. The method of clause 34, wherein the device is vertically stacked on the second device.

Clause 36. The method of clause 35, further comprising: forming a first plurality of interconnectors configured to couple a bottom metal layer in the bottom substrate with the second top metal layer in the second top substrate; and forming a second plurality of interconnectors configured to couple a bottom metal layer in the second bottom substrate to external components.

Clause 37. The method of any of clauses 34 to 36, further comprising: coupling a first die coupled to the middle substrate; and coupling a second die coupled to the second middle substrate.

Clause 38. The method of clause 37, wherein the first die is a low noise power amplifier and the device is a transmit filter, and wherein the second die is a power amplifier and the second device is a transmit filter.

Clause 39. The method of any of clauses 27 to 38, wherein the first inductor is three-dimensional (3D) inductor having serpentine windings.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a device wherein the device comprises:
   a top substrate including a plurality of top vias coupled to a first top metal layer that forms a top winding portion of a first inductor;
   a middle substrate including one or more middle metal layers, wherein the top substrate is disposed on the middle substrate and wherein the one or more middle metal layers form a middle winding portion of the first inductor; and
   a bottom substrate electrically coupled to the middle substrate opposite the top substrate, wherein a first bottom metal layer of the bottom substrate forms a bottom winding portion of the first inductor, wherein each metal layer is disposed in a plane substantially parallel to a first axis and each via extends in a second axis perpendicular to the first axis, and wherein the plurality of top vias in the top substrate, each has a height that extends in the second axis that is greater than heights in the second axis of the first top metal layer, the one or more middle metal layers and the first bottom metal layer.

2. The apparatus of claim 1, further comprising:
   a plurality of connectors configured to electrically couple the middle substrate to the bottom substrate, wherein the plurality of connectors has a height that extends in the second axis that is less than the height of the plurality of top vias in the top substrate.

3. The apparatus of claim 2, wherein each of the plurality of connectors comprises:
   a conductive pillar; and
   a solder portion, wherein the conductive pillar is coupled to the middle substrate and the solder portion is coupled to the bottom substrate.

4. The apparatus of claim 1, wherein the first top metal layer is a top metal layer of the top substrate.

5. The apparatus of claim 1, wherein the first bottom metal layer is a top metal layer of the bottom substrate.

6. The apparatus of claim 1, further comprising:
   a mold portion configured to encapsulate at least the top substrate and the middle substrate.

7. The apparatus of claim 1, further comprising:
   a die coupled to the bottom substrate.

8. The apparatus of claim 7, wherein the die is a power amplifier and the device is a transmit filter.

9. The apparatus of claim 7, wherein the die is a low noise amplifier and the device is a receive filter.

10. The apparatus of claim 1, further comprising:
    a die coupled to the middle substrate.

11. The apparatus of claim 10, wherein first inductor is disposed around the die.

12. The apparatus of claim 10, wherein the die is a power amplifier and the device is a transmit filter.

13. The apparatus of claim 10, wherein the die is a low noise amplifier and the device is a receive filter.

14. The apparatus of claim 1, wherein the middle substrate further comprises:
    one or more metal-insulator-metal (MIM) capacitors; and
    one or more inductors.

15. The apparatus of claim 14, wherein the one or more MIM capacitors are formed or connected using a first middle metal layer and a second metal middle metal layer of the one or more middle metal layers,
    wherein the one or more inductors are formed using a third middle metal layer of the one or more middle metal layers, and
    wherein a spacing between the first middle metal layer and the second metal middle metal layer is less than a spacing between the second metal middle metal layer and the third middle metal layer.

16. The apparatus of claim 14, wherein the one or more inductors are at least one of a two-dimensional (2D) inductor, a 2.5D inductor or a 3D inductor.

17. The apparatus of claim 1 further comprising a second device, wherein the second device comprises:
    a second top substrate including a plurality of second top vias coupled to a second top metal layer that forms a second top winding portion of a second inductor;
    a second middle substrate including one or more second middle metal layers, wherein the second top substrate is disposed on the second middle substrate and wherein the one or more second middle metal layers form a second middle winding portion of the second inductor; and a second bottom substrate electrically coupled to the second middle substrate opposite the second top substrate, wherein a first bottom metal layer of the second bottom substrate forms a second bottom winding portion of the second inductor.

18. The apparatus of claim 17, wherein the device is vertically stacked on the second device.

19. The apparatus of claim 18, further comprising:
a first plurality of interconnectors configured to couple a bottom metal layer in the bottom substrate with the second top metal layer in the second top substrate; and
a second plurality of interconnectors configured to couple a bottom metal layer in the second bottom substrate to external components.

20. The apparatus of claim 17, further comprising:
a first die coupled to the middle substrate; and
a second die coupled to the second middle substrate.

21. The apparatus of claim 20, wherein the first die is a low noise power amplifier and the device is a transmit filter, and wherein the second die is a power amplifier and the second device is a transmit filter.

22. The apparatus of claim 1, wherein the first inductor is three-dimensional (3D) inductor having serpentine windings.

23. The apparatus of claim 1, wherein the top substrate further comprises at least one of glass, pre-preg, silicon, ceramic, or epoxy molding compound.

24. The apparatus of claim 1, wherein the middle substrate further comprises a plurality of dielectric layers.

25. The apparatus of claim 1, wherein the bottom substrate further comprises a laminate substrate having a plurality of metal layers.

26. The apparatus of claim 1, wherein the apparatus selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

27. A method for forming a device comprising:
forming a top substrate including a plurality of top vias coupled to a first top metal layer that forms a top winding portion of a first inductor;
forming a middle substrate including one or more middle metal layers, wherein the top substrate is disposed on the middle substrate and wherein the one or more middle metal layers form a middle winding portion of the first inductor; and
forming a bottom substrate electrically coupled to the middle substrate opposite the top substrate, wherein a first bottom metal layer of the bottom substrate forms a bottom winding portion of the first inductor, wherein each metal layer is disposed in a plane substantially parallel to a first axis and each via extends in a second axis perpendicular to the first axis, and wherein the plurality of top vias in the top substrate, each has a height that extends in the second axis that is greater than heights in the second axis of the first top metal layer, the one or more middle metal layers and the first bottom metal layer.

28. The method of claim 27, further comprising:
forming a plurality of connectors electrically coupling the middle substrate to the bottom substrate, wherein the plurality of connectors has a height that extends in the second axis that is less than the height of the plurality of top vias in the top substrate.

29. The method of claim 27, further comprising:
depositing a mold portion to encapsulate at least the top substrate and the middle substrate.

30. The method of claim 27, further comprising:
coupling a die to the bottom substrate.

31. The method of claim 27, further comprising:
coupling a die coupled to the middle substrate.

32. The method of claim 31, wherein first inductor is disposed around the die.

33. The method of claim 27, wherein forming the middle substrate further comprises:
forming one or more metal-insulator-metal (MIM) capacitors; and
forming one or more inductors.

34. The method of claim 27, further comprising forming a second device,
wherein forming the second device comprises:
forming a second top substrate including a plurality of second top vias coupled to a second top metal layer that forms a second top winding portion of a second inductor;
forming a second middle substrate including one or more second middle metal layers, wherein the second top substrate is disposed on the second middle substrate and wherein the one or more second middle metal layers form a second middle winding portion of the second inductor; and
forming a second bottom substrate electrically coupled to the second middle substrate opposite the second top substrate, wherein a first bottom metal layer of the second bottom substrate forms a second bottom winding portion of the second inductor.

35. The method of claim 34, wherein the device is vertically stacked on the second device.

36. The method of claim 35, further comprising:
forming a first plurality of interconnectors configured to couple a bottom metal layer in the bottom substrate with the second top metal layer in the second top substrate; and
forming a second plurality of interconnectors configured to couple a bottom metal layer in the second bottom substrate to external components.

37. The method of claim 34, further comprising:
coupling a first die coupled to the middle substrate; and
coupling a second die coupled to the second middle substrate.

38. The method of claim 37, wherein the first die is a low noise power amplifier and the device is a transmit filter, and wherein the second die is a power amplifier and the second device is a transmit filter.

39. The method of claim 27, wherein the first inductor is three-dimensional (3D) inductor having serpentine windings.

* * * * *